United States Patent
Zhao et al.

(10) Patent No.: US 10,965,302 B1
(45) Date of Patent: Mar. 30, 2021

(54) BACKGROUND STATIC ERROR MEASUREMENT AND TIMING SKEW ERROR MEASUREMENT FOR RF DAC

(71) Applicant: Analog Devices International Unlimited Company, Limerick (IE)

(72) Inventors: Jialin Zhao, Beijing (CN); Hajime Shibata, Toronto (CA); Gil Engel, Lexington, MA (US)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 16/709,899

(22) Filed: Dec. 10, 2019

(30) Foreign Application Priority Data

Oct. 12, 2019 (WO) .................. PCTCN2019110785

(51) Int. Cl.
*H03M 1/10* (2006.01)
*H03M 7/16* (2006.01)

(52) U.S. Cl.
CPC .......... *H03M 1/1071* (2013.01); *H03M 7/165* (2013.01)

(58) Field of Classification Search
CPC ............................ H03M 1/1071; H03M 7/165
USPC .................... 341/144, 120, 118, 155
See application file for complete search history.

(56) References Cited

U.S. PATENT DOCUMENTS

| | | | |
|---|---|---|---|
| 6,081,218 A | 6/2000 | Ju et al. | |
| 8,144,043 B2 | 3/2012 | Risbo et al. | |
| 8,581,760 B2 | 11/2013 | Muhammad et al. | |
| 9,203,426 B2 | 12/2015 | Zhao et al. | |
| 9,577,657 B1 | 2/2017 | Clara | |
| 9,735,797 B2 | 8/2017 | Zhao et al. | |
| 9,838,031 B2 | 12/2017 | Dong et al. | |
| 10,693,483 B1 | 6/2020 | Luo et al. | |
| 2011/0267210 A1 | 11/2011 | Risbo et al. | |
| 2013/0082853 A1 | 4/2013 | Muhammad et al. | |
| 2017/0179975 A1 | 6/2017 | Dong et al. | |
| 2019/0173479 A1* | 6/2019 | Dyachenko | H03M 1/0641 |
| 2019/0280706 A1* | 9/2019 | Bodnar | H03M 1/201 |
| 2020/0162088 A1* | 5/2020 | Eielsen | H03F 3/189 |

OTHER PUBLICATIONS

Tang et al., A 14 bit 200 MS/s DAC with SFDR >78 dBc, IM3 < -83 dBc and NSD < -163 dBm/Hz Across the Whole Nyquist Band Enabled by Dynamic-Mismatch Mapping, IEEE Journal of Solid-State Circuits, vol. 46, No. 6, Jun. 2011, 11 pages.

(Continued)

*Primary Examiner* — Peguy Jean Pierre
(74) *Attorney, Agent, or Firm* — Patpnt Capital Group

(57) ABSTRACT

Digital to analog conversion generates an analog output corresponding to a digital input by controlling unit elements or cells using data bits of the digital input. The unit elements or cells individually make a contribution to the analog output. Due to process, voltage, and temperature variations, the unit elements or cells may have mismatches. The mismatches can degrade the quality of the analog output. To extract the mismatches, a transparent dither can be used. The mismatches can be extracted by observing the analog output, and performing a cross-correlation of the observed output with the dither. Once extracted, the unit elements or cells can be adjusted accordingly to reduce the mismatches.

35 Claims, 14 Drawing Sheets

(56) References Cited

OTHER PUBLICATIONS

He et al., A 50MHz-BW Continuous-Time ΔΣ ADC with Dynamic Error Correction Achieving 79.8dB SNDR and 95.2dB SFDR, ISSCC 2018, Session 14, High-Resolution ADCs, 14.1, 2018 IEEE International Solid-State Circuits Conference, 3 pages.

Witte et al., Background DAC Error Estimation Using a Pseudo Random Noise Based Correlation Technique for Sigma-Delta Analog-to-Digital Converters, IEEE Transactions on Circuits and Systems—I: Regular Papers, vol. 57, No. 7, Jul. 2010, 13 pages.

Taylor et al., A Mostly-Digital Variable-Rate Continuous-Time Delta-Sigma Modulator ADC, IEEE Journal of Solid-State Circuits, vol. 45, No. 12, Dec. 2010, 13 pages.

Dong et al., Adaptive Digital Noise-Cancellation Filtering Using Cross-Correlators for Continuous-Time MASH ADC in 28nm CMOS, 978-1-5090-5191-5 © 2017 IEEE, 4 pages.

Non-Final Office Action issued in U.S. Appl. No. 16/888,750 dated Oct. 1, 2020.

* cited by examiner

BACKGROUND STATIC ERROR MEASUREMENT AND TIMING SKEW ERROR MEASUREMENT FOR RF DAC

PRIORITY DATA

The present application claims priority to International Patent Application PCT/CN2019/110785 filed on Oct. 12, 2019, entitled "BACKGROUND STATIC ERROR MEASUREMENT AND TIMING SKEW ERROR MEASUREMENT FOR RF DAC", which is incorporated by its entirety herein.

TECHNICAL FIELD OF THE DISCLOSURE

The present disclosure relates generally to digital to analog converters (DACs) and, more particularly but not limited to, to background measurement of static error and timing skew error for radio frequency (RF) DACs.

BACKGROUND

DACs are used in a variety of applications to convert a digital signal into an analog signal. For example, a processor can generate a digital signal, and a DAC can convert the digital signal into an analog signal suitable for transmission over a wired or wireless medium. A DAC can be characterized by, e.g., resolution, speed/sampling rate, bandwidth, dynamic range, amount of harmonic distortion or noise, power consumption, area/size, etc.

Design of a DAC can vary depending on the target specifications. Some DACs are designed for precision, while some DACs are designed for speed. All DACs would include DAC cells, which are controllable by a data bits of a digital input and contribute to an analog output. For instance, a DAC cell can be controlled to provide a certain amount of charge to the analog output. In aggregate, the DAC cells can be operable to output an analog output that corresponds with the digital input to the DAC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
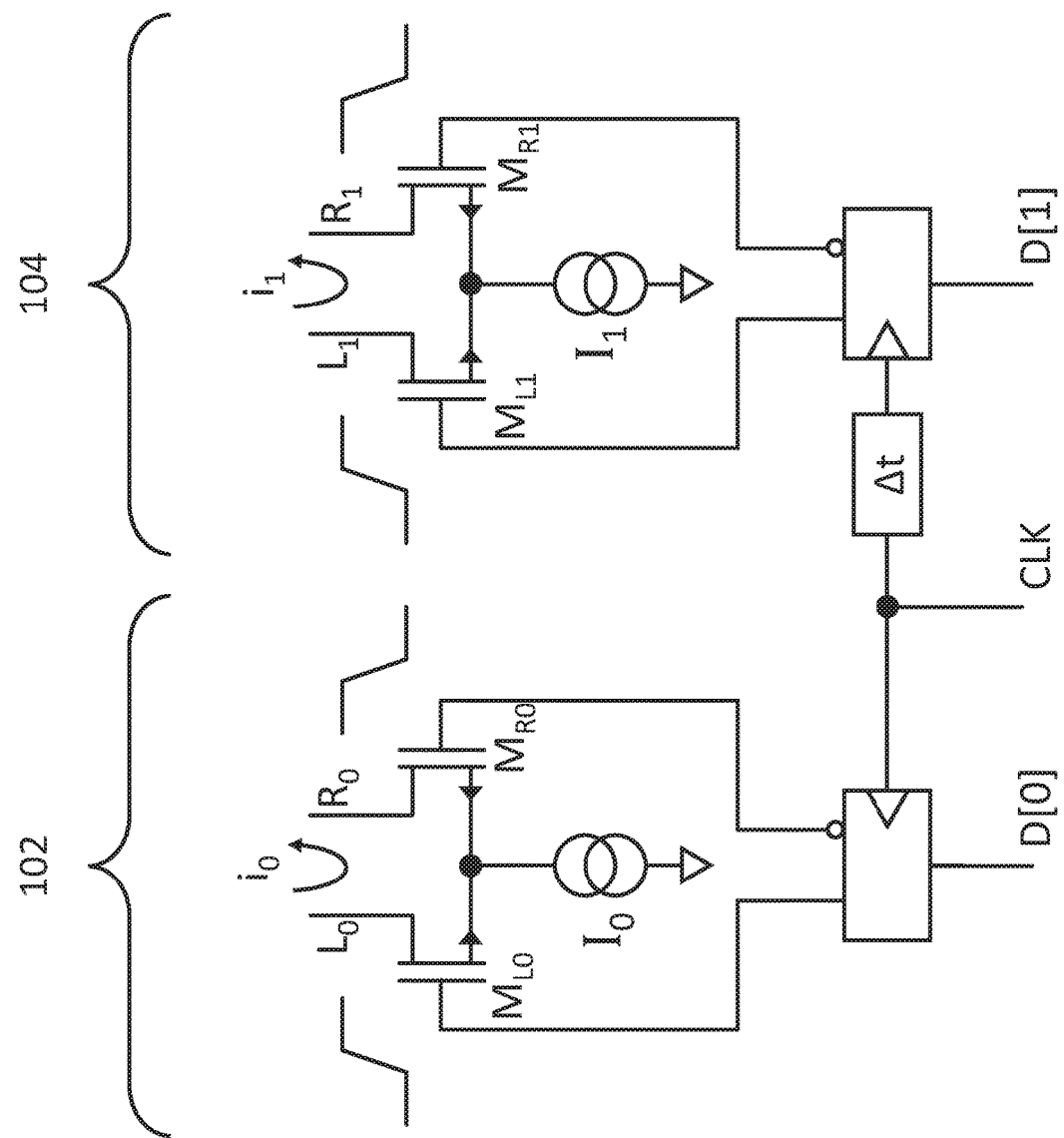
FIG. 1 shows two exemplary DAC cells, according to some embodiments of the disclosure.

Digital to analog conversion generates an analog output corresponding to a digital input by controlling DAC cells using data bits of the digital input. The DAC cells individually make a contribution to the analog output. Due to process, voltage, and temperature variations, the DAC cells may have mismatches. The mismatches can degrade the quality of the analog output. To extract the mismatches, a transparent dither can be used. The mismatches can be extracted by observing the analog output, and performing a cross-correlation of the observed output with the dither. Once extracted, the DAC cells can be adjusted accordingly to reduce the mismatches.

DAC Architectures

DACs can be implemented in a variety of architectures. In some cases, a DAC can include a string of resistors and switches controllable by data bits of a digital input to configure the string of resistors and output different voltages at the analog output. In some cases, a DAC can include an R-2R resistor ladder and switches controllable by data bits of a digital input to configure the R-2R resistor ladder and output different voltages at the analog output. In some cases, a DAC can include current sources that are individually controllable by data bits of a digital input to steer current towards or away from the output of the DAC and output different amounts of current at the analog output In some cases, a DAC can include a bank of capacitors and switches controllable by data bits of a digital input to connect the plates of the capacitors to voltage references to implement charge redistribution and output different voltages at the analog output.

Regardless of the architecture, a DAC generally has individual elements, referred to as DAC cells herein, that are sized to make contributions of certain weights to an analog output of a DAC. DAC cells can be binary coded (e.g., where DAC cells are weighted according to $2^N$). DAC cells can be thermometer coded (e.g., where DAC cells have the same weight or unit weight).

A DAC can include a segmented design, where parts of a DAC is implemented using different architectures and/or weighing schemes. For instance, one part of the data bits of the digital input can control a DAC implemented in a first architecture and the DAC cells are binary coded, and another part of the data bits of the digital input can control a DAC implemented in a second, different architecture and the DAC cells are thermometer coded. In one example, a DAC is segmented as a X-Y-Z segmented DAC. The X-Y-Z segmented DAC has a section for X most significant bits (MSBs), a section for Y intermediate significant bits (ISBs), and a section for Z least significant bits (LSBs). The MSB and ISB sections can be thermometer coded while the LSB section is binary coded. The sections can be implemented using different DAC architectures (e.g., resister string, R-2R, current steering, and capacitive DAC architectures).

What are the Mismatches of DAC Cells, and why Mismatches Matter

Due to process, temperature, and/or voltage variations, the weights of the DAC cells may not be exactly at their ideal weights. For instance, a group of DAC cells may not be exactly binary coded. For a group of DAC cells that are thermometer coded, the weights of the DAC cells may not be exactly the same as each other. Such mismatches in the weights of the DAC cells can cause DAC cells to have static errors. Also, due to process, temperature, and/or voltage variations, the switches of the DAC cells not all operate with the same timing. Such mismatches in the timing of switches can cause DAC cells to have timing skew errors and duty cycle errors.

FIG. 1 shows two exemplary DAC cells, according to some embodiments of the disclosure. For illustration, the DAC cells are current steering DAC cells. One skilled in the art would appreciate that other types of DAC cells (e.g., comprising resistors, or capacitors) would also have the same and/or similar errors associated with mismatches. FIG. 1 shows two current steering DAC cells, current steering DAC cell 102 and current steering DAC cell 104 having non-ideal weights and timing skew mismatches, according to some embodiments of the disclosure. Process, voltage, and/or temperature variations can cause non-ideal weights and timing skew mismatches.

A current steering DAC cell has a current source (denoted as $I_0$ for DAC cell 102 and as $I_1$ for DAC cell 104) and may have two switches (shown as transistors $M_{L0}$ and $M_{R0}$ for DAC cell 102, and transistors $M_{L1}$ and $M_{R1}$ for DAC cell 104) coupled to the current source for steering the current. The two switches form a differential pair to generate differential current outputs. The switches are controlled by a data bit D[k] of the digital input corresponding to the DAC cell to steer the current. Switches of the DAC cell 102 is controlled by, e.g., data bit D[0], and switches of the DAC cell 104 are controlled by, e.g., data bit D[1]. The data bit for a given DAC cell can control whether the current is steered towards the one of the differential current outputs (denoted as $L_0$ for DAC cell 102, and $L_1$ for DAC cell 104) or the other one of the different current outputs (denoted as $R_0$ for DAC cell 102, and $R_1$ for DAC cell 104) of the given DAC cell. Current output of the current steering DAC cell 102 is represented by $i_0$. Current output of the current steering DAC cell 104 is represented by $i_1$. The circuit in the current steering DAC cell ensures that exactly one of the two switches turns on to steer the current based on the data bit (e.g., D[0] and D[1]). The turning on of the switches is clocked by clock signal CLK, which is provided to each DAC cell.

Static errors are caused by DAC cells having non-ideal weights. For current steering DAC cells, the non-ideal weights can be caused by the current sources providing non-ideal amounts of current that do not match the ideal weights of the DAC cells. In some cases, static errors are called DC (direct current) errors. Static errors tend to show up and dominate at low frequencies.

Timing skew errors are caused by the timing skew difference among DAC cells. The timing skew Δt between two current steering DAC cells, can be introduced by clock path mismatches and asymmetries, i.e., the CLK signal experiences different latencies as they arrive at the DAC cells. As a result, the charge or current being delivered to the respective outputs of the DAC cells, shown as $i_0$ and $i_1$ for DAC cells 102 and 104 respectively, are mismatched due to the timing skew of the clock signal CLK arriving at the DAC cells. As the speed of the DAC increases (e.g., for RF applications, the DAC operate at giga-samples per second), timing skew errors can be more present. In other words, timing skew errors can be significant at higher frequencies. Timing skew errors can be considered a type of dynamic error.

Duty cycle errors are caused by the mismatches in the transistors among the DAC cells. As a result, the charge or current being delivered to the respective outputs of the DAC cells at different switching instances, shown as $i_0$ and $i_1$ for DAC cells 102 and 104 respectively, are mismatched due to the mismatches in the transistors. As the speed of the DAC increases (e.g., for RF applications, the DAC operate at giga-samples per second), duty cycle errors can be more present. In other words, duty cycle errors can be significant at higher frequencies. Duty cycle errors can be considered a type of dynamic error.

Figure 2:
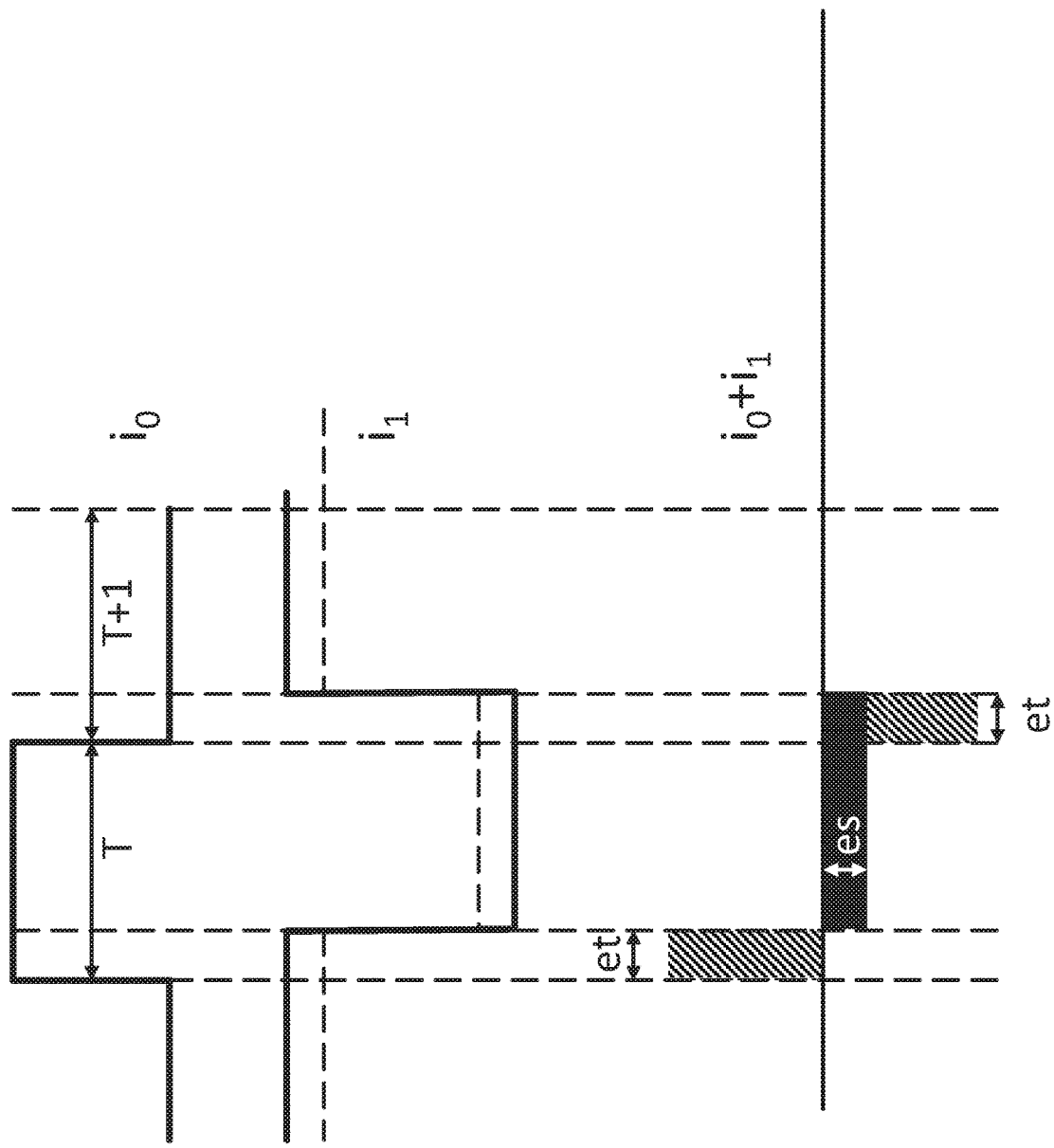
FIG. 2 shows current waveforms of the two exemplary DAC cells of FIG. 1, according to some embodiments of the disclosure.

FIG. 2 shows current waveforms, $i_0$ and $i_1$, of the two exemplary DAC cells of FIG. 1, according to some embodiments of the disclosure. The two DAC cells are driven by data bits of opposite polarity. Ideally, the current waveforms should be exactly the same but opposite of each other. However, mismatches may case the current waveforms to not be the same. The current waveforms in FIG. 2 illustrate error charges delivered at the current outputs due to static errors and timing skew errors. The non-ideal weights of the DAC cells and the different clock timings result in non-ideal currents at the outputs, illustrated by current waveforms, $i_0$ and $i_1$, for DAC cell 102 and DAC cell 104 respectively. Non-ideal weights of the DAC cells can cause different charges to be delivered. When the two ideal current waveforms of DAC cells driven by data bits of opposite polarity are summed, the error charges should be zero since the ideal current waveforms should cancel each other out. When the two non-ideal waveforms are summed, the static error can cause an error charge with height es. Timing skew between DAC cells can cause a different amount charges to be delivered at a given time due to the different clock timing. When the two non-ideal waveforms are summed, the timing skew error can cause error charges with width et (et representing the amount of timing skew). The error charge with the label es associated with static error can appear when the amount of current delivered to the output differs between DAC cells. The error charges with the label et associated with timing skew error appear when the respective current outputs are not aligned in time. An error charge caused by timing skew mismatch would be present at both the rising edge and the falling edge of the waveform. For simplicity, duty cycle errors are not shown, but can be present in the current waveforms.

Static errors, timing skew errors, and duty cycle errors matter because the total delivered charge by the DAC, which has many DAC cells, would be signal dependent. In other words, static errors, timing skew errors, and duty cycle errors can cause signal dependent errors. Signal dependent errors can introduce harmonic distortions, and degrade the performance of the DAC. The timing skew errors and duty cycle errors, in particular, among DAC cells becomes more significant for high speed DACs, since the errors caused by timing skew and duty cycle mismatches can take up a bigger portion of the entire charge in one clock cycle as the clock gets faster. Due to these errors, the Signal-to-Noise-and-Distortion Ratio (SNDR) and spurious free dynamic range (SFDR) performances of the DAC can be greatly deteriorated. Therefore, for high speed DACs, the correction of the various mismatches among the DAC cells can play a significant role in achieving high linearity.

A Background Measurement Technique to Extract Static and Timing Skew Errors

When DAC cells are exercised appropriately and the analog output of the DAC is observed, a background measurement technique can extract the static error and timing skew error of the DAC cells of a DAC. The measurement technique injects a transparent dither into the system, uses an observer analog to digital converter (ADC) to digitize the DAC analog output, and performs cross-correlation to extract the static error and timing skew error information.

Injecting a transparent dither means that a dither signal is injected and cancelled/removed. A dither signal can be a randomized bit stream (e.g., of 0's and 1's, or −1 and 1's). The randomized bit stream can be a pseudo-random sequence, such a pseudo-random binary sequence. The randomized bit stream can be generated by a pseudo-random number generator. The dither signal can be uncorrelated with the digital input of the DAC. The dither signal can be a narrow-band noise signal, e.g., a narrow-band noise signal outside of the frequency band of the digital input of the DAC. The dither signal can be a wide-band noise signal. The dither signal can have other suitable frequency responses and/or shapes of frequency responses. The dither signal can cause a transparent dither of various weights or values to be injected. Exemplary weights or values can include 0.5 LSB, 1 LSB, 1.5 LSB, 2 LSBs, etc. The extraction of static error and timing skew error would work irrespective of the weight or value of the dither signal.

Injecting the dither signal can be done in different ways. For example, a dither signal of certain weight can be injected in the digital domain (e.g., for a stand-alone DAC). In another example, a dither signal of a certain weight can be injected in the analog domain (e.g., where the DAC is downstream of an ADC). Note that the injected dither signal exercises a corresponding DAC cell in the DAC. For example, the injected dither signal can exercise an MSB DAC cell to inject one MSB. To cancel/remove the dither, a different DAC cell can be exercised using the same dither signal with opposite polarity to subtract out the injected dither signal in the analog domain. An additional/extra DAC cell can be added to the DAC for this purpose. For instance, an extra MSB DAC cell can be exercised to cancel the injected MSB. Exercising two DACs cells in this manner would yield a difference between the two DAC cells at the output of the DAC, because one DAC cell in the DAC is exercised with the dither signal, and the other DAC cell in the DAC is exercised with the same dither signal with opposite polarity. The difference between the two DAC cells would expose the static and timing skew errors relative to each other, since the two DAC cells are effectively being compared against each other. The DAC cells can have the same weight. In some cases, the DAC cells can have (slightly) different weights.

The observer ADC downstream of the DAC be used to digitize the output of the DAC, which includes the difference between the two DAC cells. The observer ADC can be at the same speed as the DAC, but can at other speed as desired (e.g., slower speed as the DAC). The observer ADC can be a voltage-controlled-oscillator (VCO) ADC, or other types of ADCs. The digital output of the observer ADC (serving as data points) can be cross-correlated the dither signal. Cross-correlation is a sliding dot product or sliding inner product of two series (i.e., the digital output of the observer ADC and the dither signal). The $1^{st}$ tap of the cross-correlation result can be used to extract the timing skew error of the DAC cell under calibration. The $0^{th}$ and the $1^{st}$ taps can be used to extract the static error of the DAC cell under calibration.

The measurement scheme can be repeated for other DAC cells by selecting a different DAC cell to cancel out the injected dither signal. The cross-correlation results generated from selecting the other DAC cells to cancel out the injected dither signal can yield static error and timing skew error of other DAC cells.

The timing skew error can be relatively small, and thus, many data points may be needed to expose and extract the timing skew error. To reduce the number of data points needed to extract the timing skew error, the cross-correlation results can be obtained twice: first by injecting the transparent dither using the dither signal, and again by injecting the transparent dither using the same dither signal with opposite polarity. By summing two cross-correlation results, a signal dependent noise floor can be cancelled out, which enables the timing skew error to be extracted with fewer data points.

There are a substantial merits of this measurement technique. First, the measurement technique can extract both the static and timing skew errors in the same step, from the same correlation result. Therefore, the measurement technique is efficient, and requires little overhead in hardware and calibration time. Second, the measurement technique is measuring the true DAC path static error. In a DAC with an R-2R resistor ladder DAC, there is typically systematic resistance mismatch calibration, but the random mismatch of the resistors in the ladder is not corrected. This measurement technique can extract the resistors' random mismatch as well. Third, since the technique can be used in the background, which means that dynamic errors, e.g., errors with voltage, temperature, and/or frequency dependence, can be measured and subsequently corrected or compensated. Fourth, since it is background calibration, it can track the temperature variation, therefore the need to implement two-factor calibration DAC is obviated and the DAC design save some area. Typically, a two-factor calibration DAC is implemented to track temperature variations and their impact on threshold voltage and mobility (i.e., current) of transistors. A two-factor calibration DAC can perform startup or foreground calibration to calibrate the DAC at room temperature, and utilizes additional circuitry to track temperature changes in the background. With this background measurement technique, the side effects of temperature variations (e.g., static error and timing skew error) can be extracted and compensated for. Therefore, the DAC circuitry can be simplified dramatically. Fifth, the measurement technique is flexible enough to be used to extract static error and timing skew error of DAC cells for a variety of DACs, including but not limited to: a stand-alone (high speed) DACs (i.e., the DAC is not being used as part of an analog to digital conversion), a DAC that generates an analog signal as part of an analog to digital conversion, a DAC inside a pipelined ADC, a DAC inside a successive-approximation-register ADC, a DAC inside a continuous-time delta sigma modulator, a DAC in a continuous-time pipelined ADC, and a DAC in a pipelined ADC having a continuous-time front end and a VCO ADC back end.

The measurement technique will add some area and power penalty. However, using a VCO ADC as the observer ADC can limit the added area and power penalty because a VCO ADC is highly/mostly digital, and its size shrinks as process becomes smaller. A rough estimate of the power consumption for digital processing circuitry for performing cross-correlation is 5 mW. Combined with the 25 mW from VCO ADC and other small digital blocks, the totally added power consumption is likely less than 40 mW.

Details, variations, and advantages of the above features are described in greater detail in the following passages.

An Exemplary DAC with Static Error and Timing Skew Measurement

Figure 3:
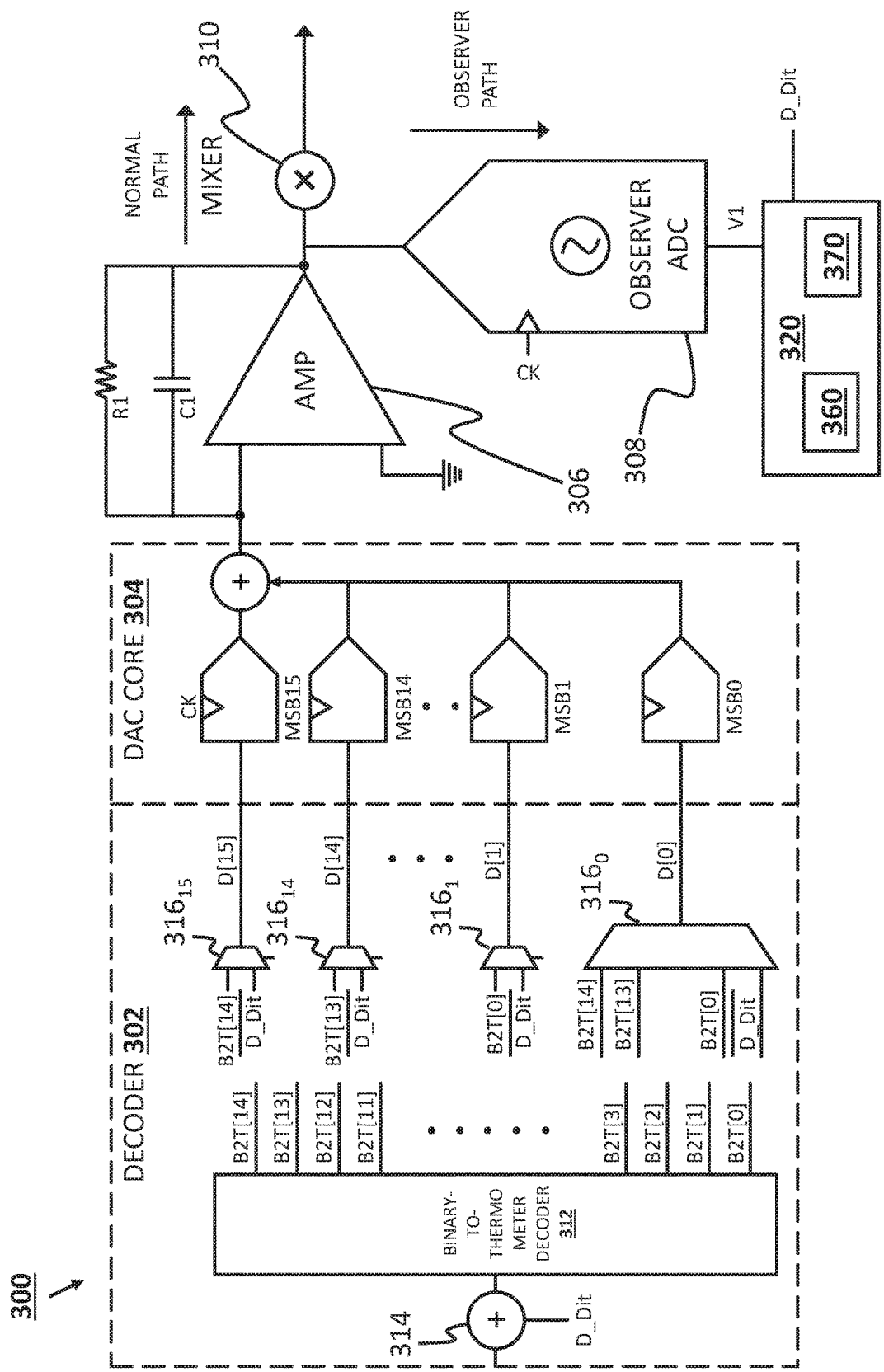
FIG. 3 shows an exemplary DAC with static error and timing skew measurement, according to some embodiments of the disclosure.

FIG. 3 shows an exemplary DAC 300 with static error and timing skew measurement, according to some embodiments of the disclosure. The exemplary DAC 300 with static error and timing skew measurement includes a decoder 302, and a plurality of DAC cells forming a DAC core 304. The DAC 300 can include an amplifier 306 at the analog output of the DAC cells, and an observer ADC 308 can observe an output of the amplifier 306, and quantize the output of the amplifier 306 (i.e., an analog output of the DAC cells). In some cases, there is a mixer 310 at the output of the amplifier 306. The mixer 310 is in the normal path of the DAC output. The observer ADC 308 is in the observer path of the DAC output.

The decoder 302 receives a digital input and a dither signal added thereto. Generally, the decoder 302 is optional, but can be included in DAC 300 to perform decoding of a digital input into data bits that control respective DAC cells in the DAC core 304. For instance, a decoder 302 can include a binary to thermometer decoder 312 for converting a binary digital input having the dither signal added thereto, into thermometer coded data bits. A decoder 302 can be included in a DAC to decode a digital input into data bits that are suitable for driving DAC cells of a segmented DAC. For instance, the decoder 302 can decode a portion of a binary digital input (e.g., MSBs and ISBs) into thermometer coded data bits to drive DAC cells with the same weights, and use a portion of the binary digital input (e.g., LSBs), without decoding, directly as binary coded data bits to drive DAC cells with binary weights. For simplicity, FIG. 3 shows a DAC 300 that receives a binary digital input and uses DAC cells in the DAC core 304 having the same weights (thermometer coded) to generate an analog output.

Although not shown explicitly in FIG. 3, the DAC 300 can be one part of a segmented DAC. Specifically, the MSB segment is shown. One skilled in the art would appreciate that the background measurement technique described herein are applicable for measuring errors of DAC cells in ISB or LSB segments, and for measuring errors of DAC cells in other types of DACs as well.

Figure 4:
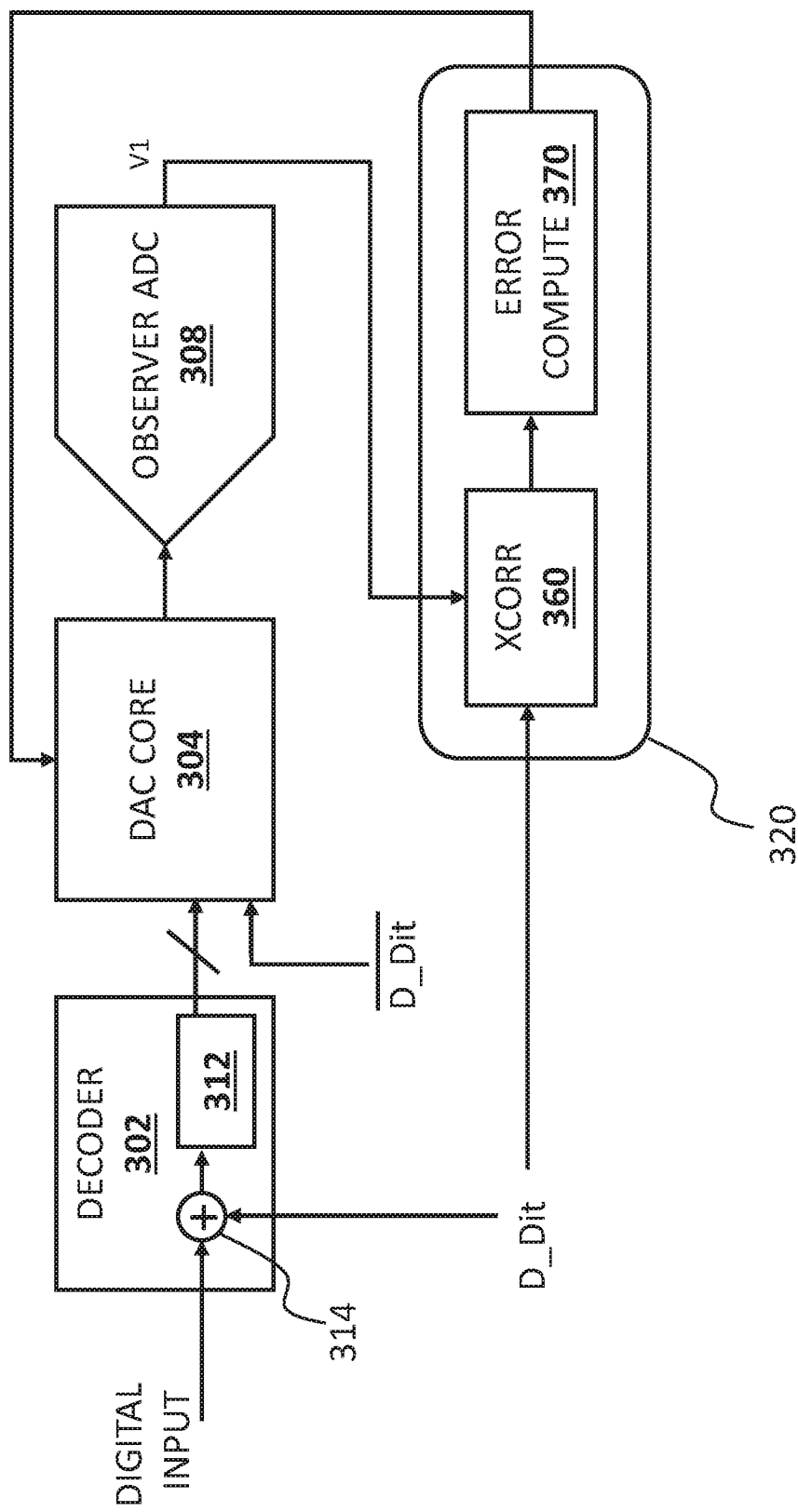
FIG. 4 shows a DAC with static error and timing skew measurement, where the dither signal is added digitally, according to some embodiments of the disclosure.
Figure 5:
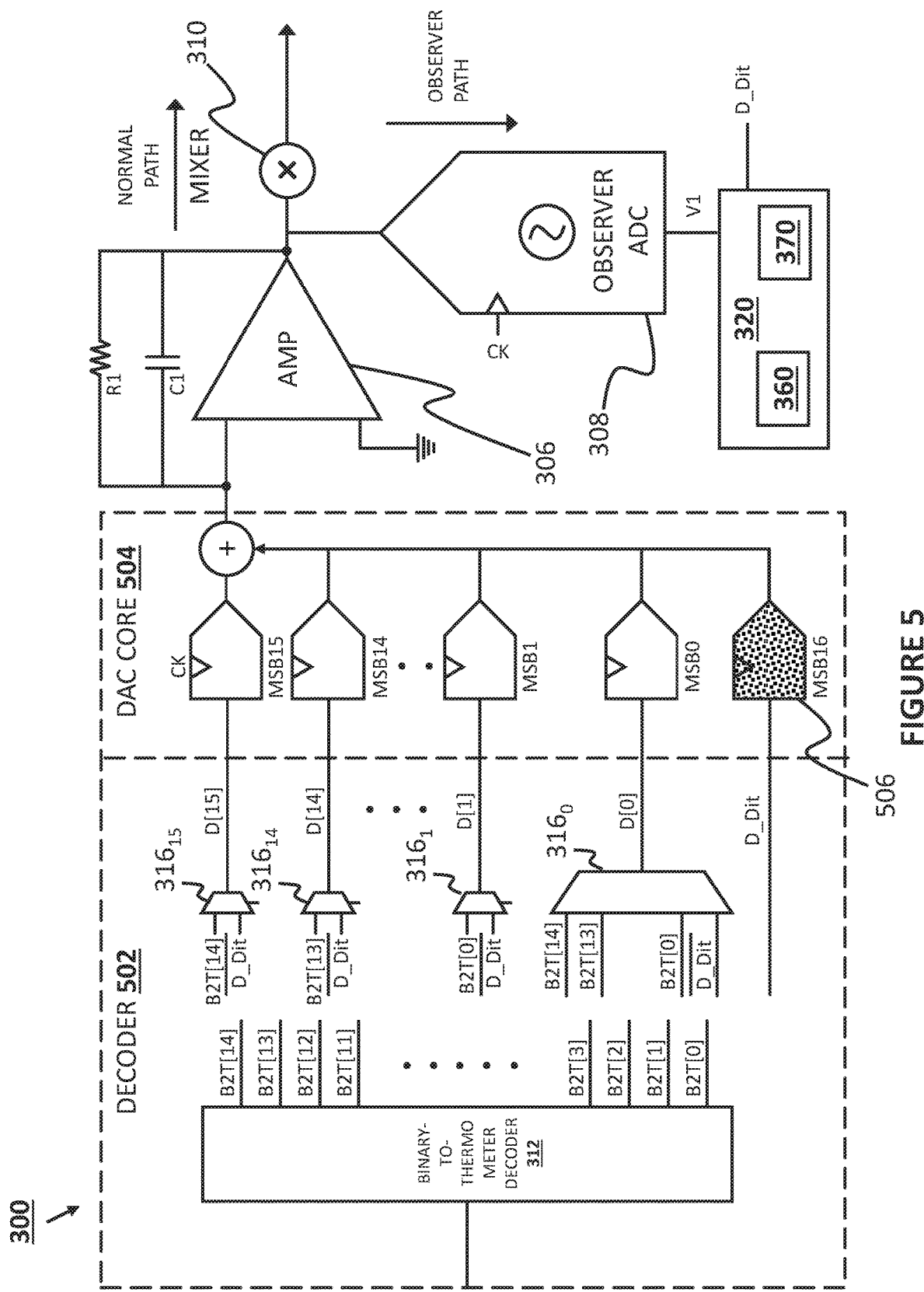
FIG. 5 shows another DAC with static error and timing skew measurement, where the dither signal is added in the analog domain, according to some embodiments of the disclosure.
Figure 6:
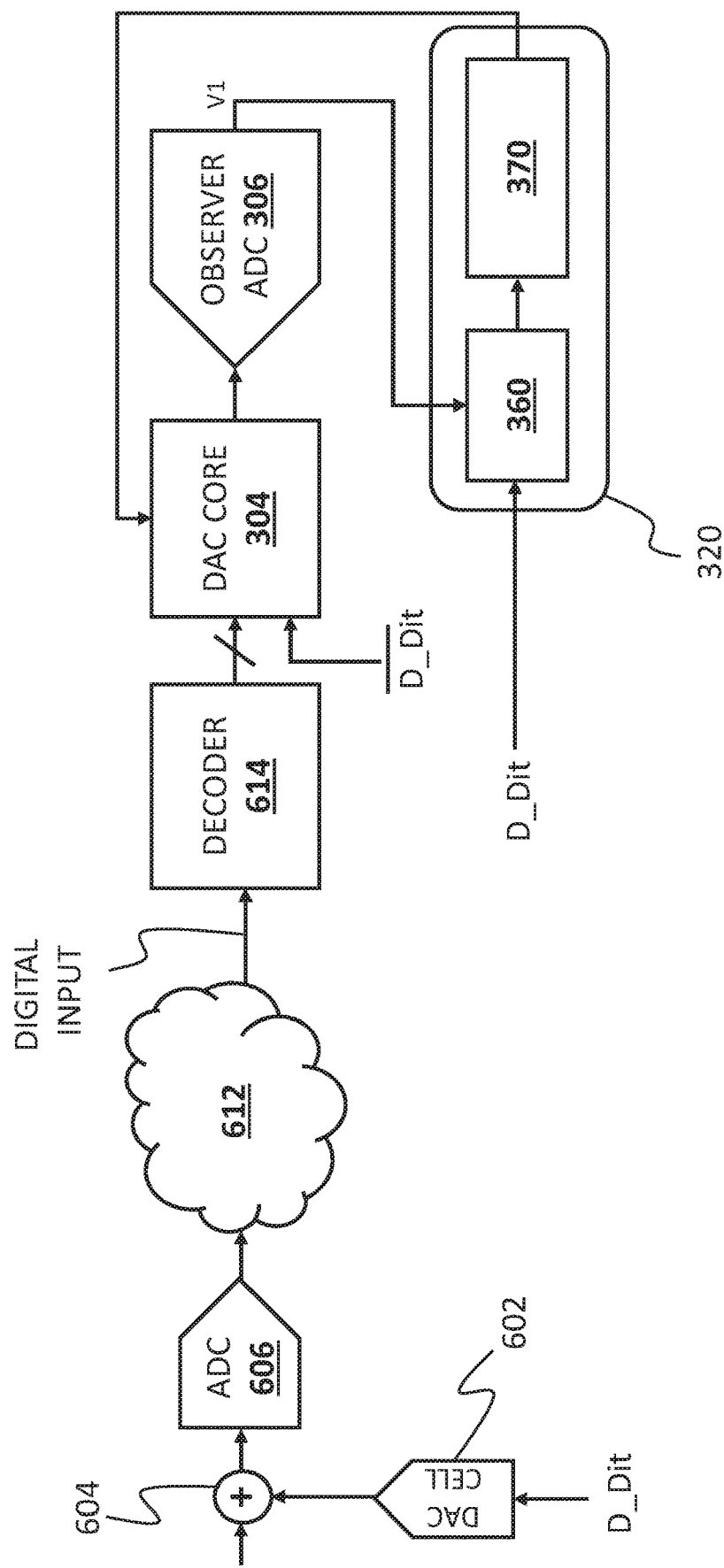
FIG. 6 shows yet another DAC with static error and timing skew measurement, where the dither signal is added in the analog domain, according to some embodiments of the disclosure.
Figure 7:
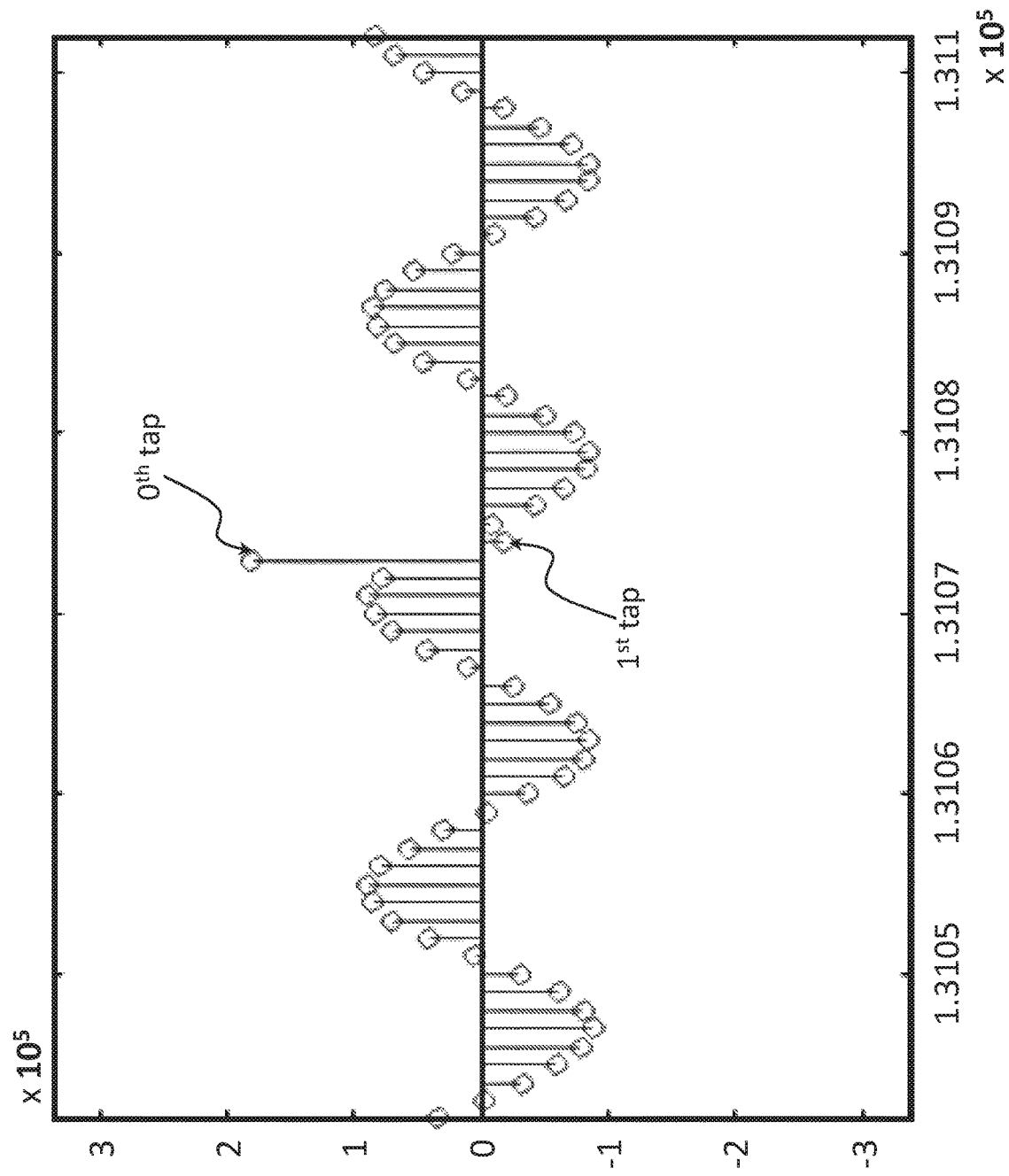
FIG. 7-12 show respective cross-correlation results for six DAC cells, according to some embodiments of the disclosure.
Figure 8:
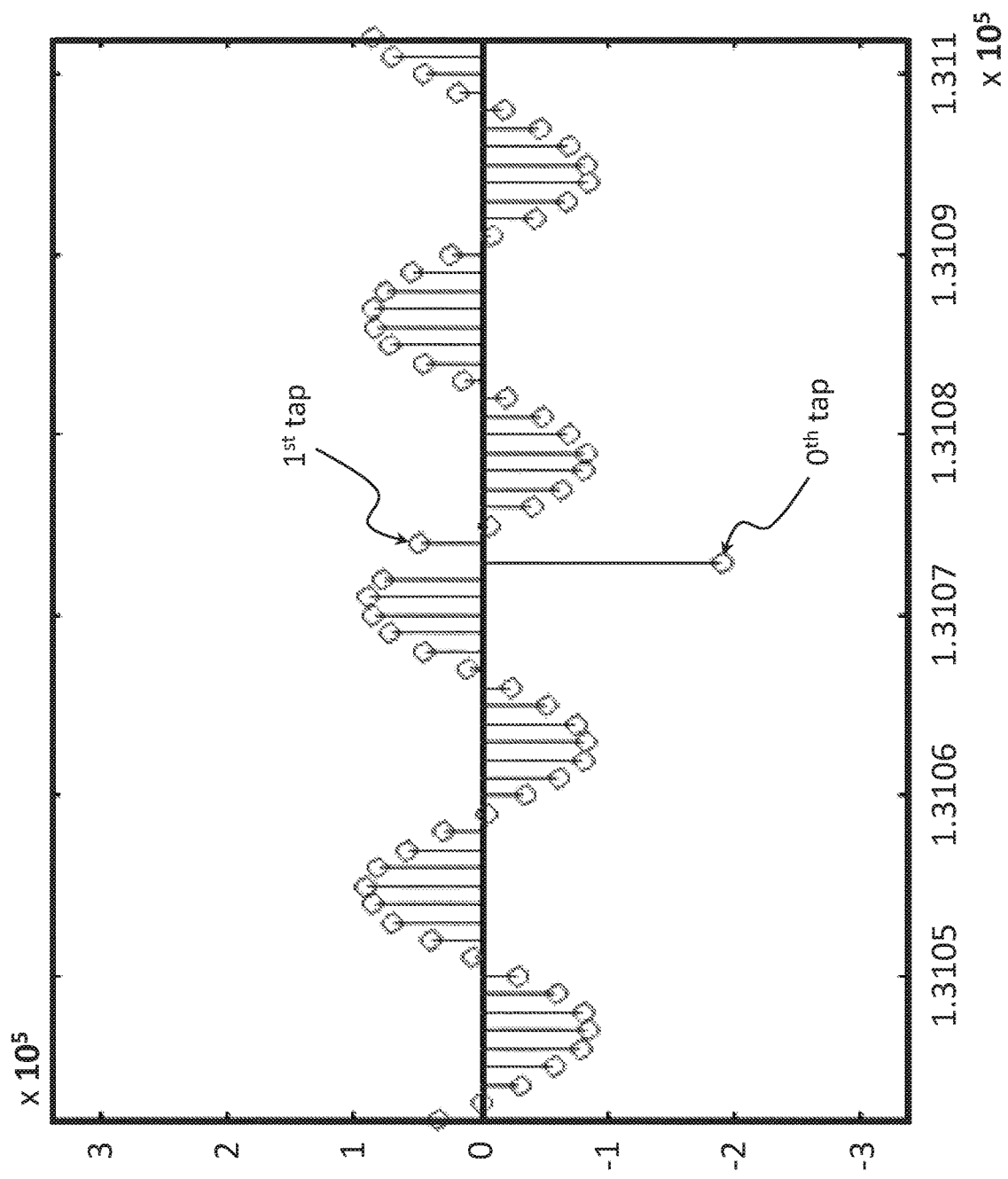
Figure 9:
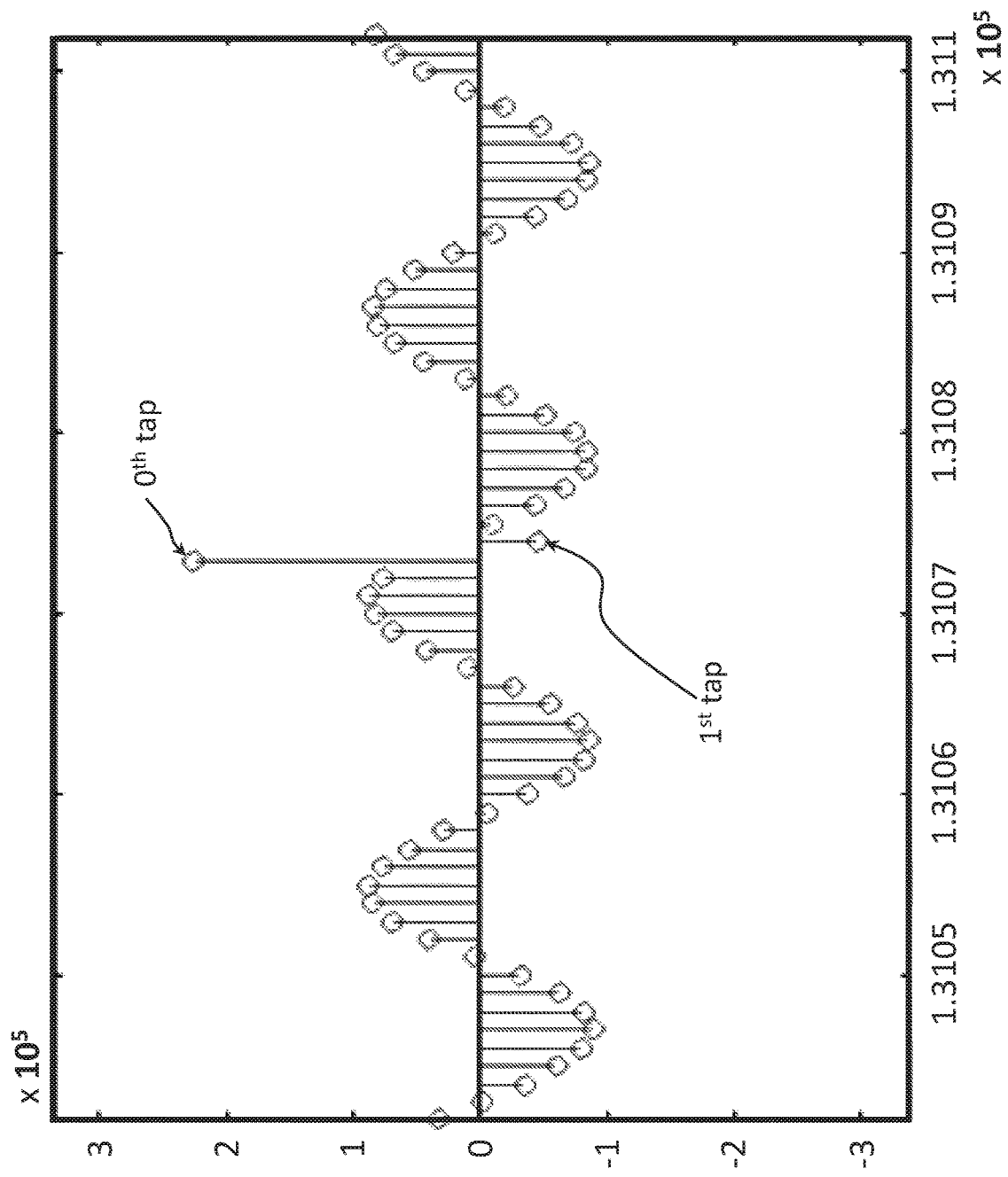
Figure 10:
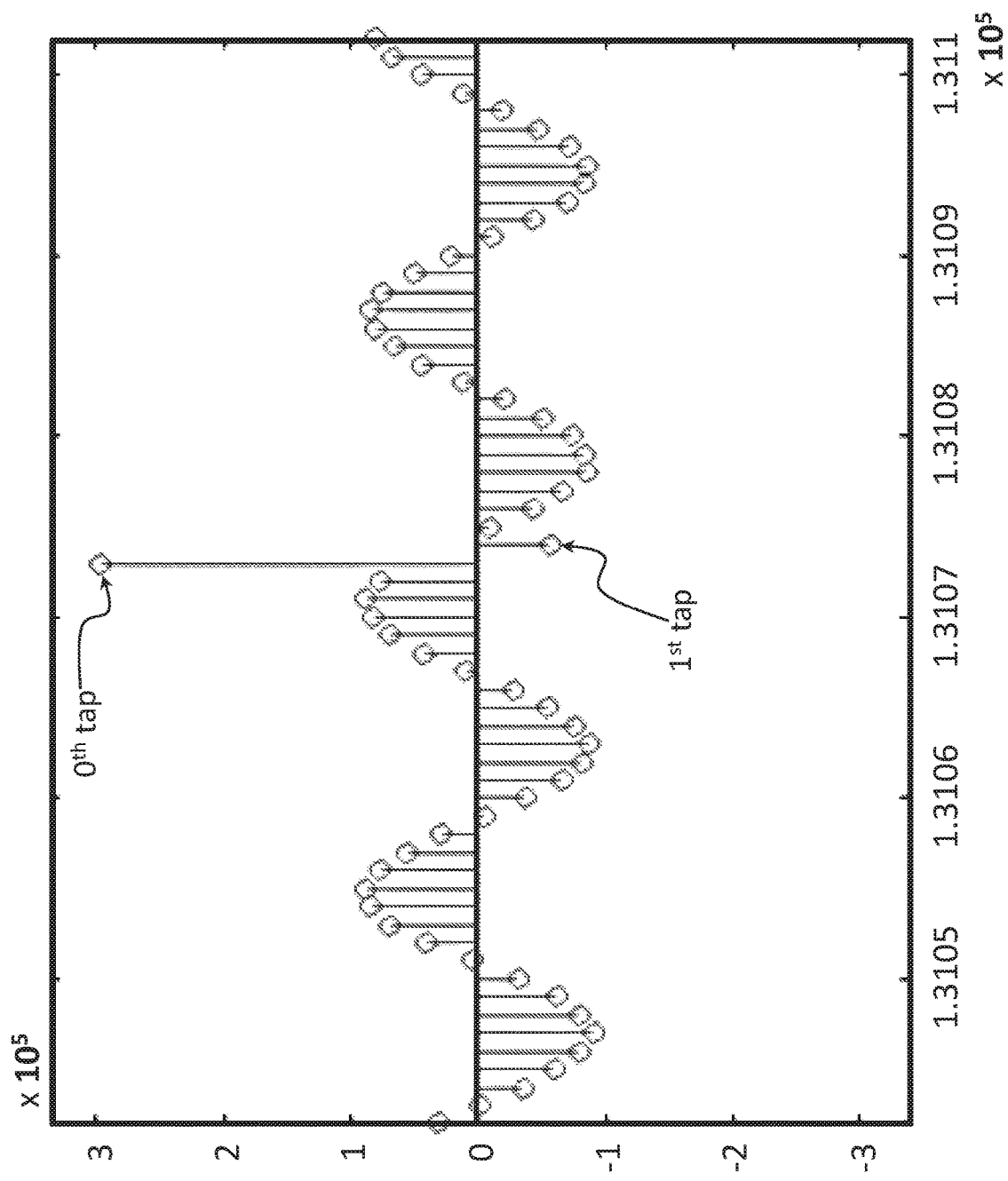
Figure 11:
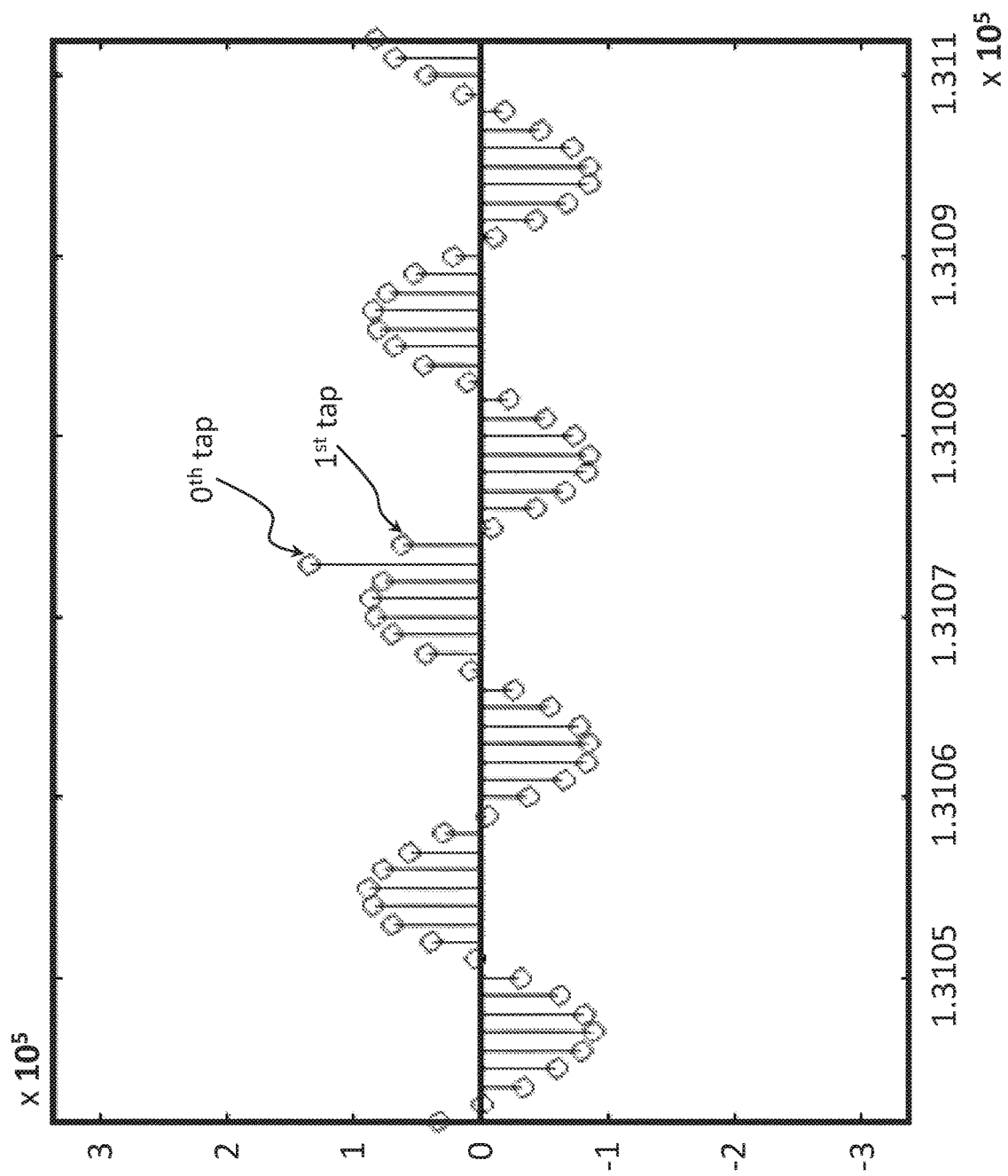
Figure 12:
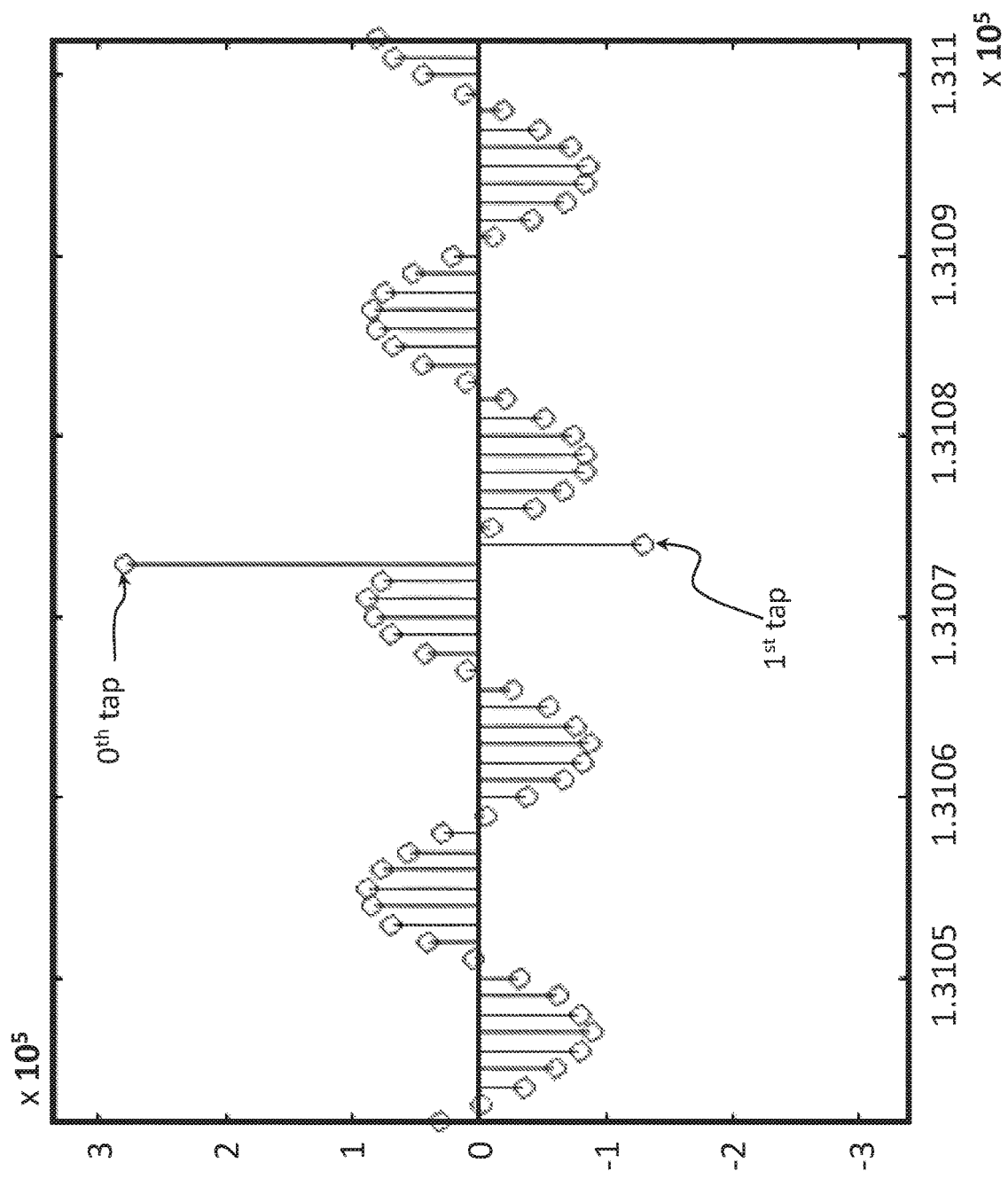

For illustration, the decoder 302 in FIG. 3 receives a 4-bit binary digital input having a dither signal D_Dit added thereto, and the binary to thermometer decoder 312 to generates a 15 thermometer coded data bits, shown as B2T[0], B2T[1], . . . B2T[13], and B2T[14], from the 4-bit binary digital input. The dither signal D_Dit added to the digital input can affect a data bit, such as B2T[0], and exercise one DAC cell in the DAC core 304. In some embodiments, the dither signal D_Dit is added digitally to the digital input to the binary to thermometer decoder 312. Adder 314 of the decoder adds the dither signal D_Dit is added digitally to the digital input. Adding the dither signal to the digital input can be done digitally or in the analog domain, which are illustrated by FIGS. 4-6.

Following the same illustrative example, to convert a 15 thermometer coded data bits to an analog output, the DAC core 304 has 15 DAC cells, each DAC cell driven by a corresponding thermometer coded data bit. An additional DAC cell is added to the DAC core 304 to subtract out the injected dither signal to implement a transparent dithering scheme. Therefore, the DAC core 304 has 16 DAC cells, shown as MSB0, MSB1, . . . MSB14, and MSB15. The outputs of the 16 DAC cells are combined/summed to form an analog output of the DAC core 304.

To expose static error and timing skew error of a DAC cell under calibration, a DAC cell can be selected to receive the dither signal with opposite polarity, $\overline{D}\_Dit$. For instance, the DAC core 304 can include a first DAC cell to receive the dither signal with opposite polarity, $\overline{D}\_Dit$, and a further DAC cells driven by data bits corresponding to the digital input and the dither signal added thereto (e.g., B2T[14-0]). This first DAC cell can thus be the DAC cell under calibration. By controlling the first DAC cell with the dither signal with opposite polarity, $\overline{D}\_Dit$, the injected dither signal is cancelled out. To expose static error and timing skew error of another DAC cell under calibration, a different DAC cell can be selected to receive the dither signal with opposite polarity, $\overline{D}\_Dit$, while the rest of the DAC cells are driven by data bits corresponding to the digital input and the dither signal added thereto (e.g., B2T[14-0]).

The decoder 302 can be implemented to allow for different DAC cells to be selected as the DAC cell under calibration, i.e., drive different DAC cells with the dither signal with opposite polarity, $\overline{D}\_Dit$. Following the same illustration, the decoder 302 can output 16 bits total, i.e., 15 thermometer coded bits, and 1 additional bit for the dither signal with opposite polarity, to drive 16 DAC cells respectively. The output bits of the decoder 302 are shown as D[0], D[1], D[2], . . . D[15] in the FIGURE. The bit for the dither signal with opposite polarity can be barrel shifted among the output bits of the decoder 302, so that the dither signal with opposite polarity, can be applied to each one of the 16 MSB DAC units, one after another. In other words, the decoder 302 can select one of the DAC cells to be the DAC cell under calibration, and another one of the DAC cells to be the DAC cell under calibration after that, and so on. When one DAC cell is selected as the DAC cell under calibration, the DAC cell is driven by the dither signal with opposite polarity, $\overline{D}\_Dit$, and the rest of the DAC cells are driven by the thermometer coded data bits, B2T[14-0].

Following the same illustrative example, when measuring the first MSB DAC cell, shown as MSB15, the decoder output D[15] would be the bit for the dither signal with opposite polarity, $\overline{D}\_Dit$. Output bits of the decoder 302, D[14] to D[1], would take the value B2T[13-0] from the B2T decoder. Output bit of the decoder 302, D[0], as the extra bit, can take the value of B2T[14], which was replaced by the bit for the dither signal with opposite polarity, $\overline{D}\_Dit$, driving MSB15.

When measuring the second MSB DAC cell, shown as MSB14, the decoder output D[14] would be the bit for the dither signal with opposite polarity, $\overline{D}\_Dit$. Output bits of the decoder 302, D[15] and D[13-1], can take the value B2T[14] and B2T[12-0] from the B2T decoder. Output bit of the decoder 302, D[0], as the extra bit, can take the value of B2T[13], which was replaced by the bit for the dither signal with opposite polarity, $\overline{D}\_Dit$, driving MSB14.

When measuring the third MSB DAC cell, shown as MSB13, the decoder output D[13] would be the bit for the dither signal with opposite polarity, $\overline{D}\_Dit$. Output bits of the decoder 302, D[15], D[14], and D[12-1], can take the value B2T[14], B2T[13], and B2T[11-0] from the B2T decoder. Output bit of the decoder 302, D[0], as the extra bit, can take the value of B2T[12], which was replaced by the bit for the dither signal with opposite polarity, $\overline{D}\_Dit$, driving MSB13.

This barrel shifting can be continue onwards to select other MSB DAC cells to be the DAC cell under calibration.

When measuring the last MSB DAC cell, shown as MSB0, the decoder output D[0] would be the bit for the dither signal with opposite polarity, $\overline{D}\_Dit$. Output bits of the decoder 302, D[15-1], can take the value B2T[14-0] from the B2T decoder.

As shown in FIG. 3, the barrel shifting can be implemented using multiplexers, shown as multiplexers $316_{15}$, $316_{15}$, ... $316_1$, and $316_0$, to select and output the appropriate bits for the output bits of the decoder 302. For example, the decoder 302 can include a first multiplexer $316_{15}$ to output one of: a first bit of the data bits (e.g., B2T[14]), and the dither signal with opposite polarity, $\overline{D}\_Dit$. The decoder 302 can include a second multiplexer $316_{14}$ to output one of: a second bit of the data bits (e.g., B2T[13]), and the dither signal with opposite polarity, $\overline{D}\_Dit$. The decoder 302 can include a third multiplexer $316_0$ to output one of: the data bits (e.g., B2T[14-0]), and the dither signal with opposite polarity $\overline{D}\_Dit$.

While the illustrative example describes barrel shifting where the DAC cells are selected sequentially one after another, e.g., from MSB15 to MSB0, the order in which the DAC cells are selected as the DAC cell under calibration does not affect the background measurement technique, and any sequence of selection of DAC cells as the DAC cell under calibration can be employed.

Other suitable switching logic can be implemented in decoder 302 to select one DAC cell to be driven by the bit for the dither signal with opposite polarity, $\overline{D}\_Dit$, and provide the data bits corresponding to the digital input and the dither signal added thereto (e.g., B2T[14-0]). For instance, the arrangement the data bits corresponding to the digital input and the dither signal added thereto (e.g., B2T [14-0]) being provided as the output bits of the decoder 302 may be scrambled in some way (as the data bits would be for a dynamic element matching scheme).

Note that the first DAC cell (e.g., DAC cell under calibration) can have the same weight as the dither signal. However, in some cases, the first DAC cell can have a different weight as the dither signal.

A VCO ADC as the Observer ADC

Referring back to FIG. 3, the observer ADC 308 quantizes the output of the DAC core 304, which is observable at the output of amplifier 306 (i.e., an analog output of the DAC cells). The output of the DAC core 304 being observed is generated as a result of the transparent dither being injected into the system, e.g., generated as a result from a digital input having a dither signal added thereto driving decoder 302, and the dither signal with opposite polarity, $\overline{D}\_Dit$, driving the first DAC cell and cancelling the added dither signal. The error charges caused by the static error and timing skew error would be observable and extractable from the output of the DAC core 304. The observer ADC 308 generates a digital output, shown as V1. The digital output can be used to extract the static error and timing skew error of the DAC cell under calibration.

The observer ADC 308 can be a VCO ADC. A VCO ADC is a first-order delta sigma ADC with the VCO acts as a continuous-time integrator with infinite direct current (DC) gain, i.e., infinite gain at DC, or zero frequency. An integrator can be particularly effective and efficient at integrating error charges et and es as seen in FIG. 2. Other non-integrating ADCs can also extract the error charges et and es, but may have to run at a much higher speed than the VCO ADC or an integrating ADC. In addition, because a VCO ADC is mostly digital, VCO ADC has very small footprint in 28 nm process and can continue scale with process. One VCO ADC can be as large as 0.1 mm$^2$ and consumes 25 mW. The VCO ADC acting as the observer ADC 308 can digitize the output of the DAC core 304 through the amplifier 306 (e.g., a transimpedance amplifier). The extra load from the VCO ADC acting as the observer ADC 308 to the amplifier output is relatively small and would not impact the performance of the normal path through the mixer 310.

The DAC 300 further includes digital processing circuitry 320 to cross-correlate the digital output V1 and the dither signal D_Dit, and to extract a static error and a timing skew error of the first DAC cell based on the cross-correlation of the digital output V1 and the dither signal D_Dit. For instance, the digital processing circuitry 320 can include cross-correlation circuitry 360 to perform cross-correlation of data points of digital output V1 and the dither signal D_Dit. The cross-correlation circuitry 360 is explained in greater detail in the passages describing the exemplary cross-correlation results shown in FIGS. 7-12. The digital processing circuitry 320 further includes error computation circuitry 370 to compute the static error and timing skew error from the cross-correlation result from cross-correlation circuitry 360.

Adding the Dither Signal

As discussed previously, depending on the implementation, the dither signal D_Dit can be added in different ways.

FIG. 4 shows a DAC with static error and timing skew measurement, where the dither signal D_Dit is added digitally, according to some embodiments of the disclosure. To add the dither signal digitally, a digital adder 314 is included in the decoder 302 to add the dither signal D_Dit to the digital input of the decoder 302.

FIG. 5 shows a DAC with static error and timing skew measurement, where the dither signal D_Dit is added in the analog domain, according to some embodiments of the disclosure. A decoder 502 is implemented as discussed herein to supply data bits and a bit of the dither signal with opposite polarity to the DAC cells. However, decoder 502 lacks a digital adder for adding the dither signal digitally. The dither signal D_Dit is added in the analog domain. The dither signal D_Dit in the DAC core 504, which includes a dither DAC cell 506, e.g., MSB16, that is driven by the dither signal D_Dit. In this illustrative example, the dither DAC cell 506 receives the dither signal D_Dit. Another DAC cell in the DAC core 504, driven by the dither signal with opposite polarity, $\overline{D}\_Dit$, cancels out the dither added to implement the transparent dithering scheme. The DAC core 504 thus has 17 DAC cells (i.e., two additional DAC cells). The dither DAC cell 506 can be seen as a reference DAC cell against which other DAC cells are measured. The barrel shifting implemented by decoder 502 (as described in relation to FIG. 3) can enable measurement the static error and timing skew error of other DAC cells in DAC core 504, one DAC cell at a time. The dither DAC cell 506 can have the same weight as the DAC cell under calibration, or the dither DAC cell 506 can have a different weight as the DAC cell under calibration.

FIG. 6 shows a DAC with static error and timing skew measurement, where the dither signal D_Dit is added in the analog domain, according to some embodiments of the disclosure. The signal chain seen in FIG. 6 can be found in a transceiver. A decoder 614 is implemented as discussed herein to supply data bits and a bit of the dither signal with opposite polarity to the DAC cells. However, decoder 614 lacks a digital adder for adding the dither signal digitally. ADC 606 is upstream of the DAC, and may generate the digital input to decoder 614. The dither signal D_Dit is added to the analog input of the ADC 606 in the analog domain. In this illustrative example, a dither DAC cell 602 is included, and the dither DAC cell 602 receives the dither signal D_Dit. A summation node 604 adds an analog equivalent of the dither signal D_Dit (generated by the dither DAC cell 602) to an analog input of ADC 606. The ADC 606 generates a digital output signal having the dither signal added thereto. The digital output signal can be processed by digital processing circuitry 612. The digital processing circuitry 612 can generate the digital input having the dither signal added thereto. The digital input having the dither signal added thereto is then processed by decoder 614. The dither DAC cell 602 can have the same weight as the first DAC cell (e.g., a DAC cell under calibration), or the dither DAC cell 602 can have a different weight as the first DAC cell.

The signal path between the point where the dither signal is injected and the point the dither signal is cancelled in FIG. 6 is less controlled than the signal path between the point where the dither signal is injected and the point the dither signal is cancelled in FIG. 5. Accordingly, the implementation in FIG. 6 is less preferred since the measurement scheme may be polluted by other errors in the signal path.

Additionally, injecting the dither signal in the analog domain (e.g., FIGS. 5-6) is less preferred than dither injection in the digital domain (e.g., FIGS. 3-4) because the dither DAC cell itself can introduce an error to the measurement scheme.

Deriving the Static Error and Timing Skew Error Based on Cross-Correlation and Exemplary Cross-Correlation Results Referring back to FIG. 2, the top waveform labeled $i_0$ can correspond to a dither signal added (digitally or in the analog domain), and can be treated as the ideal waveform. The middle waveform labeled $i_1$ can correspond to the first DAC cell, e.g., a DAC cell under calibration, driven by the dither signal with opposite polarity. The middle waveform shows the non-ideality introduced by static and timing skew errors. Accordingly, the middle waveform is scaled due to the static error, and is time-shifted due to the timing skew error. The transparent dither scheme means that the DAC output would yield a sum of the top and middle waveforms, i.e., the bottom waveform labeled $i_0+i_1$. The bottom waveform can represent the difference of the DAC cell exercised by the injected dither signal, and the DAC cell under calibration. Accordingly, the DAC output having a transparent dither having the sum of the top and middle waveforms has and exposes error charges coming from both sources, with error charge with label es representing error from the static error, and error charges with label et representing error coming from timing skew (where an error charge with label et is present at the rising edge and another error charge with label et is present at the falling edge of the top waveform). The observer ADC, e.g., a VCO ADC, can act as an integrator and digitize the DAC output having the transparent dither, to capture the error charges with labels et and es.

If the static error is ignored and only timing skew error is taken into account, the Z-domain transformation of the bottom waveform, i.e., the DAC output having a transparent dither, would be: $-1+1-et+etZ^{-1}=-et+etZ^{-1}$. If both the static error and the timing skew error are taken into account, the Z-domain transformation of the bottom waveform would be: $-(1+es)+1-et+etZ^{-1}=-(es+et)+etZ^{-1}$. When the digital output V1 of the observer ADC is cross-correlated with the dither signal D_Dit, the $0^{th}$ tap of the cross-correlation result would yield $-(es+et)$ and the $1^{st}$ tap of the cross-correlation result would yield et. This means that the cross-correlation result yields two equations and two unknowns (e.g., es and et):

$-(es+et)$=value of 0th tap of cross-correlation result   Equation 1:

$et$=value of 1st tap of cross-correlation result   Equation 2:

The timing skew error, as represented by et can be obtained directly from the value of the $1^{st}$ tap of the cross-correlation result, according to Equation 2. The static error, as represented by es can be obtained from the value of the $0^{th}$ tap and the value of the $1^{st}$ tap of the cross-correlation result. Substituting the value of the $1^{st}$ tap of the cross-correlation result, i.e., et, into $-(es+et)$, which equals to the value of the $0^{th}$ tap of the cross-correlation result, can allow es to be solved/determined.

The cross-correlation can be performed, e.g., by cross-correlation circuitry 360 of FIGS. 3-6. The $0^{th}$ and $1^{st}$ tap of the cross-correlation result include information of both static and timing skew errors, and can be used, e.g., by error computation circuitry 370 of FIGS. 3-6, to extract/estimate both the static and timing skew errors of the DAC cell under calibration from just one cross-correlation.

While it is possible to extract both static and timing skew errors from the cross-correlation result, some implementations envisioned by the disclosure may only extract the static error (and not the timing skew error), and some implementations envisioned by the disclosure may only extract the timing skew error (and not the static error). In other words, it is not necessary that both static and timing skew errors are extracted from the cross-correlation result.

FIG. 7-12 show respective cross-correlation results for six DAC cells, according to some embodiments of the disclosure. One can observe strong correlations in the cross-correlation results. The $0^{th}$ tap and the $1^{st}$ tap are labeled in each FIGURE.

Note that the cross-correlation results show a signal dependent noise floor, which can be seen from the sine wave envelop. The noise floor can affect the extraction accuracy. One way to address the error extraction accuracy signal dependent noise floor is to increase the number of data points of the digital output of the observer ADC to improve the cross-correlation signal to noise ratio (i.e., making the $0^{th}$ and $1^{st}$ taps much larger than the noise floor. The error extraction could need 16 million cross-correlation points or more.

Another way to address the error extraction accuracy in the presence of signal dependent noise floor is to inject the same dither signal twice using the transparent dither scheme and obtain two cross-correlation results: first time with the dither signal (where the dither signal with opposite polarity drives a DAC cell under calibration), and the second time with the dither signal with opposite polarity (where the dither signal drives the DAC cell under calibration). By summing the two cross-correlation results (tap-wise summation) obtained from injecting the dither signal and from injecting the dither signal with opposite polarity, respectively, the signal dependent noise floor is cancelled while the static/timing skew errors are doubled. Extracted errors from the summed cross-correlation results can be halved (i.e., divided by two). 256,000 cross-correlation points may be sufficient to extract the errors down to 0.05% level accuracy.

Performing cross-correlation can be computationally expensive, and thus, the background measurement scheme may run only from time to time (i.e., not all the time).

Methods for Extracting Static Errors and Timing Skew Errors

Figure 13:
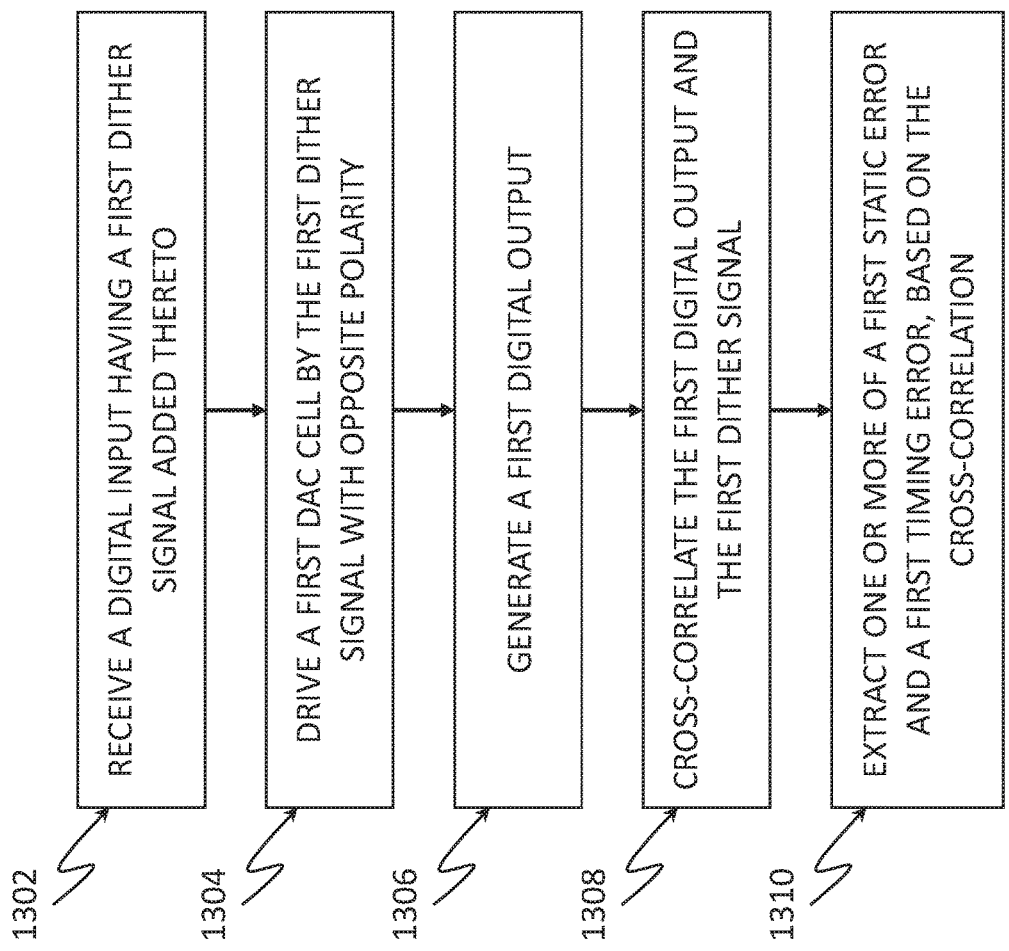
FIG. 13 is a flow diagram illustrating a method for extracting static errors and timing skew errors of a DAC, according to some embodiments of the disclosure.

FIG. 13 is a flow diagram illustrating a method for extracting errors of a DAC, according to some embodiments of the disclosure. For instance, the errors can include one or more of: static error, and timing skew error. The DAC has a decoder (e.g., decoder 302 of FIGS. 3 and 4, decoder 502 of FIG. 5, and decoder 614 of FIG. 6) and DAC cells driven by outputs of the decoder (e.g., D[15]-D[0] of FIG. 3).

In 1302, the decoder can receive a digital input having a first dither signal added thereto. An example of the first dither signal is the dither signal D_Dit as seen in FIGS. 3-6).

In 1304, a first DAC cell (e.g., a DAC cell under calibration as described in relation to FIG. 3) can be driven by the first dither signal with opposite polarity. As previously illustrated by FIG. 3, DAC cell labeled MSB15, if selected as the DAC cell under calibration, can be driven by a bit of the dither signal with opposite polarity, $\overline{D}$_Dit. The decoder can implement switching circuitry to output a bit of the dither signal with opposite polarity, $\overline{D}$_Dit, as the bit D[15] that drives the DAC cell labeled MSB15. The first DAC driven by the first dither signal with opposite polarity cancels out the dither signal, D_Dit, added to the digital input, effectively implementing a transparent dithering scheme.

In 1306, an observer ADC (e.g., observer ADC 308 of FIGS. 3-6) can generate a first digital output (e.g., V1 of FIGS. 3-6) by digitizing a first analog output of the DAC resulting from the first dither signal with opposite polarity driving the first DAC cell (i.e., resulting from the transparent dither being applied).

In 1308, digital processing circuitry (e.g., digital processing circuitry 320 of FIGS. 3-6, specifically, cross-correlation circuitry 360) can cross-correlate the first digital output and the first dither signal. Examples of cross-correlation results are shown in FIGS. 7-12.

In 1310, digital processing circuitry (e.g., digital processing circuitry 320 of FIGS. 3-6, specifically, error computation circuitry 370) can extract the one or more of: a first static error and a first timing skew error of the first DAC cell based on the cross-correlation of the first digital output and the first dither signal. Examples of cross-correlation results and how the cross-correlation exposes the static error and timing skew error of the DAC cell under calibration are explained in passages associated with FIGS. 2, and 7-12.

In some embodiments, the decoder or other suitable circuitry in the digital domain adds the first dither signal to the digital input digitally. Adding the first dither signal digitally is illustrated by FIGS. 3-4. In some embodiments, the first dither signal is added to an analog input signal of an ADC, thus, in an analog domain. The ADC generates a digital input having the first dither signal added thereto. Various embodiments that adds the first dither signal in an analog domain is illustrated by FIGS. 5-6.

As discussed previously, the zeroth tap and the first tap set up two equations and two unknowns, allowing the static error and timing skew error to be extracted from the cross-correlation result. Extracting the first static error and the first timing skew error can include deriving the first timing skew error based on a value of a first tap of the cross-correlation of the first digital output and the first dither signal. Extracting the first static error and the first timing skew error can include deriving the first static error based on a value of a zeroth tap and a value of a first tap of the cross-correlation of the first digital output and the first dither signal.

To extract the static error and timing skew error in the presence of the signal dependent noise floor, the measurement can be performed twice: once with the dither signal injected as the transparent dither, and another time with the dither signal with opposite polarity injected as the transparent dither. To perform the measurement with the dither signal with opposite polarity injected as the transparent dither, the method can further include receiving, by the decoder, the digital input having the first dither signal with opposite polarity added thereto, driving the first DAC cell by the first dither signal, generating a first complementary digital output by digitizing a first complementary analog output of the DAC resulting from the first dither signal driving the first DAC cell, and cross-correlating the first complementary digital output and the first dither signal with opposite polarity. Then, (1) the cross-correlation of the first digital output and the first dither signal, and (2) cross-correlation of the first complementary digital output and the first dither signal with opposite polarity, are summed. The first static error and the first timing skew error of the first DAC cell can be extracted based on a value of a zeroth tap and a value of a first tap of summed cross-correlation results. Because the errors are doubled when the cross-correlation results are summed, the first static error and the first timing skew error of the first DAC cell can be extracted based on half of a value of a zeroth tap and half of a value of a first tap of summed cross-correlation results.

To measure the static error and timing skew error of another DAC cell under calibration, 1302-1310 can be repeated for the second DAC cell. For instance, the method can further include receiving, by the decoder, the digital input having a second dither signal added thereto, driving a second DAC cell (e.g., another DAC cell under calibration) by the second dither signal with opposite polarity, generating a second digital output by digitizing a second analog output of the DAC resulting from the second dither signal with opposite polarity driving the second DAC cell, cross-correlating the second digital output and the second dither signal, and extracting one or more of: a second static error and a second timing skew error of the second DAC cell, based on the cross-correlation of the second digital output and the second dither signal. Various switching schemes, such as the ones illustrated in FIG. 3, can be used to select the second DAC cell or any other DAC cells to be the next DAC cell under calibration.

Figure 14:
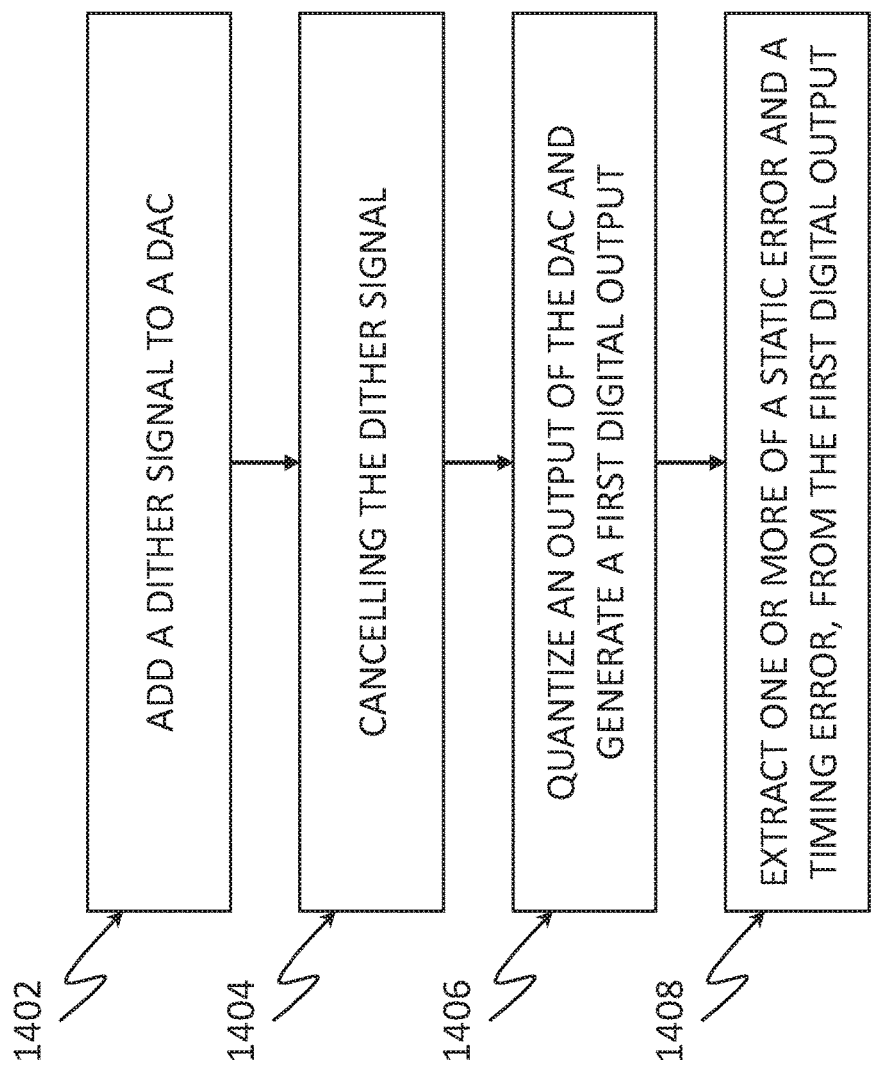
FIG. 14 is a flow diagram illustrating another method for extracting static errors and timing skew errors of a DAC, according to some embodiments of the disclosure.

FIG. 14 is a flow diagram illustrating another method for extracting static errors and timing skew errors of a DAC, according to some embodiments of the disclosure. In 1402, a dither signal is added to the DAC. Three different schemes for adding the dither signal to the DAC are illustrated in FIGS. 3-6. In 1404, a DAC cell in the DAC cancels the dither signal injected to the DAC. For instance, the DAC cell can be driven by the dither signal with opposite polarity to cancel the added dither signal. As a result of 1402 and 1404, a transparent dither is injected (as illustrated by the examples described in relation to FIGS. 3-6). In 1406, an observer ADC (e.g., observer ADC 308 of FIGS. 3-6) quantizes the output of the DAC and generates a first digital output. In 1408, digital processing circuitry (e.g., digital processing circuitry 320 of FIGS. 3-6) extracts one or more of: a static error and a timing skew error of the DAC cell, from the first digital output.

The cross-correlation results yield the static error and timing skew error of the DAC cell under calibration. As discussed previously, the zeroth tap and the first tap set up two equations and two unknowns, allowing the static error and timing skew error to be extracted from the cross-correlation result. Extracting one or more of the static error and the timing skew error, can include cross-correlating the dither signal with the first digital output, and obtaining the static error and the timing skew error from a value of a zeroth tap and a value of a first tap 14 of the cross-correlation. Extracting one or more of the static error and the timing skew error, can include deriving the timing skew error based on a value of a first tap of the cross-correlation of the first digital output and the dither signal. Extracting one or more of the static error and the timing skew error, can include deriving the static error based on a value of a zeroth tap and a first tap of the cross-correlation of the first digital output and the dither signal. Examples of cross-correlation results and how the cross-correlation exposes the static error and timing skew error of the DAC cell under calibration are explained in passages associated with FIGS. 2, and 7-12.

To extract the static error and timing skew error in the presence of the signal dependent noise floor, the measurement can be performed twice: once with the dither signal injected as the transparent dither, and another time with the dither signal with opposite polarity injected as the transparent dither. To perform the measurement with the dither signal with opposite polarity injected as the transparent dither, the method can further include adding the dither signal with opposite polarity to the DAC, cancelling, by the DAC cell in the DAC, the dither signal with opposite polarity injected to the DAC, quantizing an output of the DAC and generating a second digital output, and extracting one or more of the static error and the timing skew error of the DAC cell, from the first digital output and the second digital output. Specifically, extracting one or more of the static error and the timing skew error, comprises: cross-correlating the dither signal with the first digital output, cross-correlating the dither signal with opposite polarity with the second digital output, summing the cross-correlation results, and obtaining the static error and the timing skew error from half of a value of a zeroth tap and half of a value of a first tap of the summed cross-correlation results.

Adding the dither signal to the DAC can include adding the dither signal to the input of the DAC digitally. Such a scheme is illustrated by FIGS. 3-4. Adding the dither signal to the DAC can include adding the dither signal to a dither DAC cell in the DAC core. Such a scheme is illustrated by FIG. 5. In some cases, adding the dither signal to the DAC includes adding the dither signal to an analog input signal of an ADC, and generating, by the ADC, the input of the DAC having the dither signal added thereto. Such a scheme is illustrated by FIG. 6.

To measure the static error and timing skew error of another DAC cell under calibration, 1402-1408 can be repeated for another DAC cell. Various switching schemes, such as the ones illustrated in FIG. 3, can be used to select the other DAC cell or any other DAC cells to be the next DAC cell under calibration.

While it is possible to extract both static and timing skew errors from the cross-correlation result (as illustrated by the methods in FIGS. 13 and 14), some implementations envisioned by the disclosure may only extract the static error (and not the timing skew error), and some implementations envisioned by the disclosure may only extract the timing skew error (and not the static error). In other words, it is not necessary that both static and timing skew errors are extracted from the cross-correlation result.

EXAMPLES

Example 1 is a method for extracting errors of a digital to analog converter (DAC) having a decoder and a plurality of DAC cells driven by outputs of the decoder, the method comprising: receiving, by the decoder, a digital input having a first dither signal added thereto; driving a first DAC cell by the first dither signal with opposite polarity; generating a first digital output by digitizing a first analog output of the DAC resulting from the first dither signal with opposite polarity driving the first DAC cell; cross-correlating the first digital output and the first dither signal; and extracting one or more of: a first static error and a first timing skew error of the first DAC cell based on the cross-correlation of the first digital output and the first dither signal.

In Example 2, the method of Example 1 can optionally include: adding, by the decoder, the first dither signal to the digital input digitally.

In Example 3, the method of Example 1 can optionally include adding the first dither signal to an analog input signal of an ADC; and generating, by the ADC, the digital input having the first dither signal added thereto.

In Example 4, the method of any one of Examples 1-3 can optionally include extracting the one or more of: the first static error and the first timing skew error, comprising deriving the first timing skew error based on a value of a first tap of the cross-correlation of the first digital output and the first dither signal.

In Example 5, the method of any one of Examples 1-4 can optionally include extracting the one or more of: the first static error and the first timing skew error, comprising deriving the first static error based on a value of a zeroth tap and a value of a first tap of the cross-correlation of the first digital output and the first dither signal.

In Example 6, the method of any one of Examples 1-5 can optionally include: receiving, by the decoder, the digital input having the first dither signal with opposite polarity added thereto; driving the first DAC cell by the first dither signal; generating a first complementary digital output by digitizing a first complementary analog output of the DAC resulting from the first dither signal driving the first DAC cell; cross-correlating the first complementary digital output and the first dither signal with opposite polarity; and summing the cross-correlation of the first digital output and the first dither signal and cross-correlation of the first complementary digital output and the first dither signal with opposite polarity.

In Example 7, the method of Example 6 can optionally include extracting one or more of the first static error and the first timing skew error, comprising extracting one or more of: the first static error and the first timing skew error of the first DAC cell based on a value of a zeroth tap and a value of a first tap of summed cross-correlation results.

In Example 8, the method of Example 6 or 7 can optionally include extracting one or more of the first static error and the first timing skew error, comprising extracting one or more of: the first static error and the first timing skew error of the first DAC cell based on half of a value of a zeroth tap and half of a value of a first tap of summed cross-correlation results.

In Example 9, the method of any one of Examples 1-8 can optionally include: receiving, by the decoder, the digital input having a second dither signal added thereto; driving a second DAC cell by the second dither signal with opposite polarity; generating a second digital output by digitizing a second analog output of the DAC resulting from the second dither signal with opposite polarity driving the second DAC cell; cross-correlating the second digital output and the second dither signal; and extracting one or more of: a second static error and a second timing skew error of the second DAC cell based on the cross-correlation of the second digital output and the second dither signal.

Example 10 is a digital to analog converter (DAC) with error measurement, the digital to analog converter comprising: a decoder to receive a digital input and a dither signal added thereto; a plurality of DAC cells, comprising: a first DAC cell to receive the dither signal with opposite polarity; and further DAC cells driven by data bits corresponding to the digital input and the dither signal added thereto; and an observer ADC to quantize an analog output of the DAC cells resulting from the dither signal with opposite polarity driving the first DAC cell, and to generate a digital output.

In Example 11, the DAC of Example 10 can optionally include: digital processing circuitry to cross-correlate the digital output and the dither signal, and to extract a static error and a timing skew error of the first DAC cell based on the cross-correlation of the digital output and the dither signal.

In Example 12, the DAC of Example 10 or 11 can optionally include the decoder comprising a binary to thermometer decoder to convert the digital input and the dither signal added thereto into the data bits.

In Example 13, the DAC of any one of Examples 10-12 can optionally include the decoder comprising: an adder to add the dither signal to the digital input.

In Example 14, the DAC of any one of Examples 10-12 can optionally include: a dither DAC cell to receive the dither signal; a summation node to add the dither signal to an analog input of an ADC; and the ADC to generate the digital input having the dither signal added thereto.

In Example 15, the DAC of any one of Examples 10-14 can optionally include the decoder comprising: a first multiplexer to output one of: a first bit of the data bits, and the dither signal with opposite polarity; and a second multiplexer to output one of: a second bit of the data bits, and the dither signal with opposite polarity.

In Example 16, the DAC of any one of Examples 10-15 can optionally include the decoder comprising: a third multiplexer to output one of: the data bits, and the dither signal with opposite polarity.

In Example 17, the DAC of any one of Examples 10-16 can optionally include the observer ADC is a VCO analog to digital converter.

In Example 18, the DAC of any one of Examples 10-17 can optionally include the first DAC cell having a same weight as the dither signal.

In Example 19, the DAC of any one of Examples 10-17 can optionally include the first DAC cell has a different weight than the dither signal.

In Example 20, the DAC of any one of Examples 10-19 can optionally include the DAC being a stand-alone DAC.

In Example 21, the DAC of any one of Examples 10-19 can optionally include the DAC generating an analog signal as part of an analog to digital conversion.

Example 22 is a digital to analog converter (DAC) with error measurement, the digital to analog converter comprising: a decoder to receive a digital input; a plurality of DAC cells, comprising: a first DAC cell to receive the dither signal with opposite polarity; further DAC cells driven by data bits corresponding to the digital input; and a dither DAC cell to receive the dither signal; and an observer ADC to quantize an analog output of the DAC cells resulting from the dither signal with opposite polarity driving the first DAC cell, and to generate a digital output.

In Example 23, the DAC of Example 22 can optionally include: digital processing circuitry to cross-correlate the digital output and the dither signal, and to extract a static error and a timing skew error of the first DAC cell based on the cross-correlation of the digital output and the dither signal.

In Example 24, the DAC of Example 22 or 23 can optionally include the decoder comprising: a first multiplexer to output one of: a first bit of the data bits, and the dither signal with opposite polarity; and a second multiplexer to output one of: a second bit of the data bits, and the dither signal with opposite polarity.

In Example 25, the DAC of any one of Examples 22-24 can optionally include the decoder comprising: a third multiplexer to output one of: the data bits, and the dither signal with opposite polarity.

In Example 26, the DAC of any one of Examples 22-25 can optionally include the observer ADC being a VCO analog to digital converter.

Example 27 is a method for extracting errors of a digital to analog converter (DAC), comprising: adding a dither signal to the DAC; cancelling, by a DAC cell in the DAC, the dither signal injected to the input of the DAC; quantizing the output of the DAC and generating a first digital output; and extracting one or more of: a static error and a timing skew error of the DAC cell from the first digital output.

In Example 28, the method of Example 27 can optionally include extracting one or more of the static error and the timing skew error, comprising: cross-correlating the dither signal with the first digital output; and obtaining the static error and the timing skew error from a value of a zeroth tap and a value of a first tap of the cross-correlation.

In Example 29, the method of Example 27 or 28 can optionally include: adding the dither signal with opposite polarity to the DAC; cancelling, by the DAC cell in the DAC, the dither signal with opposite polarity injected to the DAC; quantizing the output of the DAC and generating a second digital output; and extracting one or more of the static error and the timing skew error of the DAC cell, from the first digital output and the second digital output.

In Example 30, the method of any one of Examples 27-29 can optionally include extracting one or more of the static error and the timing skew error, comprising: cross-correlating the dither signal with the first digital output; cross-correlating the dither signal with opposite polarity with the second digital output; summing the cross-correlation results; and obtaining the static error and the timing skew error from half of a value of a zeroth tap and half of a value of a first tap of the summed cross-correlation results.

In Example 31, the method of any one of Examples 27-30 can optionally include adding the dither signal to the DAC comprising: adding the dither signal to an input of the DAC digitally.

In Example 32, the method of any one of Examples 27-30 can optionally include adding the dither signal to the DAC comprises: adding the dither signal to an analog input signal of an ADC; and generating, by the ADC, an input of the DAC having the dither signal added thereto.

In Example 33, the method of any one of Examples 27-30 can optionally include adding the dither signal to the DAC comprising: driving a dither DAC cell with the dither signal.

In Example 34, the method of any one of Examples 27-33 can optionally include extracting one or more of the static error and the timing skew error comprising: deriving the timing skew error based on a value of a first tap of a cross-correlation of the first digital output and the dither signal.

In Example 35, the method of any one of Examples 27-34 can optionally include extracting one or more of the static error and the timing skew error, comprising: deriving the static error based on a value of a zeroth tap and a first tap of a cross-correlation of the first digital output and the dither signal.

Example 36 is an apparatus comprising means for performing any one of the methods described herein.

Other Implementation Notes, Variations, and Applications

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

The background technique for measuring DAC static error and timing skew error are particularly suitable for high speed, wide bandwidth, high precision applications where the performance of the DAC is critical. Applications which can greatly benefit from the architecture include: instrumentation, testing, spectral analyzers, military purposes, radar, wired or wireless communications, mobile telephones (especially because standards continue to push for higher speed communications), and base stations. These products are employed in wired and wireless communications, instrumentation, radar, electronic warfare, and other applications.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the background measurement technique, such as the processes shown in FIGS. 13-14, illustrate only some of the possible functions that may be executed by, or within, the systems illustrated in FIGS. 3-6. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion.

Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for extracting errors of a digital to analog converter (DAC) having a decoder and a plurality of DAC cells driven by outputs of the decoder, the method comprising:

receiving, by the decoder, a digital input having a first dither signal added thereto;
driving a first DAC cell by the first dither signal with opposite polarity;
generating a first digital output by digitizing a first analog output of the DAC resulting from the first dither signal with opposite polarity driving the first DAC cell;
cross-correlating the first digital output and the first dither signal; and
extracting one or more of: a first static error and a first timing skew error of the first DAC cell based on the cross-correlation of the first digital output and the first dither signal.

2. The method of claim 1, further comprising:
adding, by the decoder, the first dither signal to the digital input digitally.

3. The method of claim 1, wherein extracting the one or more of: the first static error and the first timing skew error, comprises:
deriving the first timing skew error based on a value of a first tap of the cross-correlation of the first digital output and the first dither signal.

4. The method of claim 1, wherein extracting the one or more of: the first static error and the first timing skew error, comprises:
deriving the first static error based on a value of a zeroth tap and a value of a first tap of the cross-correlation of the first digital output and the first dither signal.

5. The method of claim 1, further comprising:
receiving, by the decoder, the digital input having the first dither signal with opposite polarity added thereto;
driving the first DAC cell by the first dither signal;
generating a first complementary digital output by digitizing a first complementary analog output of the DAC resulting from the first dither signal driving the first DAC cell;
cross-correlating the first complementary digital output and the first dither signal with opposite polarity; and
summing the cross-correlation of the first digital output and the first dither signal and cross-correlation of the first complementary digital output and the first dither signal with opposite polarity.

6. The method of claim 5, wherein extracting one or more of the first static error and the first timing skew error, comprises:
extracting one or more of: the first static error and the first timing skew error of the first DAC cell based on a value of a zeroth tap and a value of a first tap of summed cross-correlation results.

7. The method of claim 6, wherein extracting one or more of the first static error and the first timing skew error, comprises:
extracting one or more of: the first static error and the first timing skew error of the first DAC cell based on half of a value of a zeroth tap and half of a value of a first tap of summed cross-correlation results.

8. The method of claim 1, further comprising:
receiving, by the decoder, the digital input having a second dither signal added thereto;
driving a second DAC cell by the second dither signal with opposite polarity;
generating a second digital output by digitizing a second analog output of the DAC resulting from the second dither signal with opposite polarity driving the second DAC cell;
cross-correlating the second digital output and the second dither signal; and
extracting one or more of: a second static error and a second timing skew error of the second DAC cell based on the cross-correlation of the second digital output and the second dither signal.

9. The method of claim 1, further comprising:
adding the first dither signal to an analog input signal of an analog to digital converter; and
generating, by the analog to digital converter, the digital input having the first dither signal added thereto.

10. A digital to analog converter (DAC) with error measurement, the digital to analog converter comprising:
a decoder to receive a digital input and a dither signal added thereto;
a plurality of DAC cells, comprising:
a first DAC cell to receive the dither signal with opposite polarity; and
further DAC cells driven by data bits corresponding to the digital input and the dither signal added thereto; and
an observer analog to digital converter (ADC) to quantize an analog output of the DAC cells resulting from the dither signal with opposite polarity driving the first DAC cell, and to generate a digital output.

11. The DAC of claim 10, further comprising:
digital processing circuitry to cross-correlate the digital output and the dither signal, and to extract a static error and a timing skew error of the first DAC cell based on the cross-correlation of the digital output and the dither signal.

12. The DAC of claim 10, wherein the decoder comprises:
a binary to thermometer decoder to convert the digital input and the dither signal added thereto into the data bits.

13. The DAC of claim 10, wherein the decoder comprises:
an adder to add the dither signal to the digital input.

14. The DAC of claim 10, wherein the decoder comprises:
a first multiplexer to output one of: a first bit of the data bits, and the dither signal with opposite polarity; and
a second multiplexer to output one of: a second bit of the data bits, and the dither signal with opposite polarity.

15. The DAC of claim 10, wherein the decoder comprises:
a third multiplexer to output one of: the data bits, and the dither signal with opposite polarity.

16. The DAC of claim 10, wherein the observer ADC is a voltage-controlled-oscillator analog to digital converter.

17. The DAC of claim 10, wherein the first DAC cell has a different weight than the dither signal.

18. The DAC of claim 10, further comprising:
a dither DAC cell to receive the dither signal;
a summation node to add the dither signal to an analog input of an analog to digital converter; and
the analog to digital converter to generate the digital input having the dither signal added thereto.

19. The DAC of claim 10, wherein the first DAC cell has a same weight as the dither signal.

20. The DAC of claim 10, wherein the DAC is a stand-alone DAC.

21. The DAC of claim 10, wherein the DAC generates an analog signal as part of an analog to digital conversion.

22. A method for extracting errors of a digital to analog converter (DAC), comprising:
adding a dither signal to the DAC;
cancelling, by a DAC cell in the DAC, the dither signal injected to the DAC;
quantizing an output of the DAC and generating a first digital output; and cross-correlating the dither signal with the first digital output
extracting one or more of: a static error and a timing skew error of the DAC cell from the cross-correlation.

23. The method of claim 22, wherein extracting one or more of the static error and the timing skew error, comprises:
obtaining the static error and the timing skew error from a value of a zeroth tap and a value of a first tap of the cross-correlation.

24. The method of claim 22, further comprising:
adding the dither signal with opposite polarity to the DAC;
cancelling, by the DAC cell in the DAC, the dither signal with opposite polarity injected to the DAC;
quantizing the output of the DAC and generating a second digital output; and
extracting the static error and the timing skew error of the DAC cell from the first digital output and the second digital output.

25. The method of claim 24, wherein adding the dither signal to the DAC comprises:
driving a dither DAC cell with the dither signal.

26. The method of claim 24, wherein extracting one or more of the static error and the timing skew error, comprises:
cross-correlating the dither signal with the first digital output;
cross-correlating the dither signal with opposite polarity with the second digital output;
summing the cross-correlations; and
obtaining the static error and the timing skew error from half of a value of a zeroth tap and half of a value of a first tap of the summed cross-correlation.

27. The method of claim 22, wherein adding the dither signal the DAC comprises:
adding the dither signal to an input of the DAC digitally.

28. The method of claim 22, wherein adding the dither signal to the DAC comprises:
adding the dither signal to an analog input signal of an analog to digital converter; and
generating, by the analog to digital converter, an input of the DAC having the dither signal added thereto.

29. The method of claim 22, wherein extracting one or more of the static error and the timing skew error comprises:
deriving the timing skew error based on a value of a first tap of a cross-correlation of the first digital output and the dither signal.

30. The method of claim 22, wherein extracting one or more of the static error and the timing skew error comprises:
deriving the static error based on a value of a zeroth tap and a first tap of a cross-correlation of the first digital output and the dither signal.

31. A digital to analog converter (DAC) with error measurement, the digital to analog converter comprising:
a decoder to receive a digital input;
a plurality of DAC cells, comprising:
a dither DAC cell to receive a dither signal; and
a first DAC cell to receive a dither signal with opposite polarity;
further DAC cells driven by data bits corresponding to the digital input; and
an observer analog to digital converter to quantize an analog output of the DAC cells resulting from the dither signal with opposite polarity driving the first DAC cell, and to generate a digital output.

32. The DAC of claim 31, further comprising:
digital processing circuitry to cross-correlate the digital output and the dither signal, and to extract a static error and a timing skew error of the first DAC cell based on the cross-correlation of the digital output and the dither signal.

33. The DAC of claim 31, wherein the decoder comprises:
a first multiplexer to output one of: a first bit of the data bits, and the dither signal with opposite polarity; and
a second multiplexer to output one of: a second bit of the data bits, and the dither signal with opposite polarity.

34. The DAC of claim 31, wherein the decoder comprises:
a third multiplexer to output one of: the data bits, and the dither signal with opposite polarity.

35. The DAC of claim 31, wherein the observer ADC is a voltage-controlled-oscillator analog to digital converter.

* * * * *